(12) United States Patent
Kim

(10) Patent No.: US 11,748,036 B2
(45) Date of Patent: Sep. 5, 2023

(54) STORAGE DEVICE AND OPERATING METHOD THEREOF

(71) Applicant: SK hynix Inc., Icheon-si Gyeonggi-do (KR)

(72) Inventor: Chu Seok Kim, Cheongju-si Chungcheongbuk-do (KR)

(73) Assignee: SK hynix Inc., Icheon-si (KR)

( * ) Notice: Subject to any disclaimer, the term of this patent is extended or adjusted under 35 U.S.C. 154(b) by 0 days.

(21) Appl. No.: 17/500,723

(22) Filed: Oct. 13, 2021

(65) Prior Publication Data

US 2022/0035570 A1 Feb. 3, 2022

Related U.S. Application Data

(62) Division of application No. 16/661,828, filed on Oct. 23, 2019, now abandoned.

(30) Foreign Application Priority Data

May 28, 2019 (KR) ........................ 10-2019-0062715

(51) Int. Cl.
*G06F 3/06* (2006.01)
(52) U.S. Cl.
CPC .......... *G06F 3/0659* (2013.01); *G06F 3/0604* (2013.01); *G06F 3/0673* (2013.01)
(58) Field of Classification Search
None
See application file for complete search history.

(56) References Cited

U.S. PATENT DOCUMENTS

| 7,352,630 | B2 | 4/2008 | Lee et al. |
| 8,159,892 | B2 | 4/2012 | Kang |
| 8,228,740 | B2 * | 7/2012 | Joo ..................... G11C 16/3459 |
| | | | 365/185.14 |
| 8,887,011 | B2 * | 11/2014 | Luo ..................... G06F 11/1072 |
| | | | 714/721 |
| 10,297,336 | B2 | 5/2019 | Hong et al. |
| 10,529,432 | B2 * | 1/2020 | Park ....................... G11C 29/52 |

(Continued)

FOREIGN PATENT DOCUMENTS

| KR | 1020100004731 A | 1/2010 |
| KR | 1020120069109 A | 6/2012 |

*Primary Examiner* — Elias Mamo
(74) *Attorney, Agent, or Firm* — WILLIAM PARK & ASSOCIATES LTD.

(57) ABSTRACT

A storage device for performing a read operation together with a program operation includes a memory device for storing data and a memory controller for controlling the memory device. The memory device includes an allow bit setting register for storing allow bits which are compared with fail bits included in read data read in a read operation and includes a read operation controller for controlling the memory device to immediately perform the read operation after a program operation. The memory controller includes a command generator for generating a command instructing the memory device to perform an operation, includes a bad block processor for setting a bad block, based on a result of the read operation performed by the memory device, and includes a fail information controller for setting an operation mode of a next read operation, based on the result of the read operation performed by the memory device.

11 Claims, 17 Drawing Sheets

(56) References Cited

U.S. PATENT DOCUMENTS

| | | |
|---|---|---|
| 10,770,158 B1 * | 9/2020 | Gupta .................... G11C 29/24 |
| 2007/0159890 A1 | 7/2007 | Cho |
| 2011/0179322 A1 | 7/2011 | Lee et al. |
| 2014/0068384 A1 * | 3/2014 | Kwak ................. G06F 11/1068 |
| | | 714/773 |
| 2017/0075596 A1 * | 3/2017 | Iwai .................. G11C 16/3459 |
| 2019/0294368 A1 * | 9/2019 | Hiraishi ................. G06F 3/064 |

* cited by examiner

| | E | P1 | P2 | P3 | P4 | P5 | P6 | P7 | P8 | P9 | P10 | P11 | P12 | P13 | P14 | P15 |
|---|---|---|---|---|---|---|---|---|---|---|---|---|---|---|---|---|
| QSB Page | 1 | 1 | 1 | 1 | 0 | 0 | 0 | 0 | 0 | 0 | 1 | 1 | 0 | 0 | 1 | 1 |
| MSB Page | 1 | 1 | 1 | 0 | 0 | 1 | 1 | 1 | 1 | 0 | 0 | 0 | 0 | 0 | 0 | 1 |
| CSB Page | 1 | 1 | 0 | 0 | 0 | 0 | 0 | 1 | 1 | 1 | 1 | 1 | 1 | 0 | 0 | 0 |
| LSB Page | 1 | 0 | 0 | 0 | 0 | 0 | 1 | 1 | 0 | 0 | 0 | 1 | 1 | 1 | 1 | 1 |

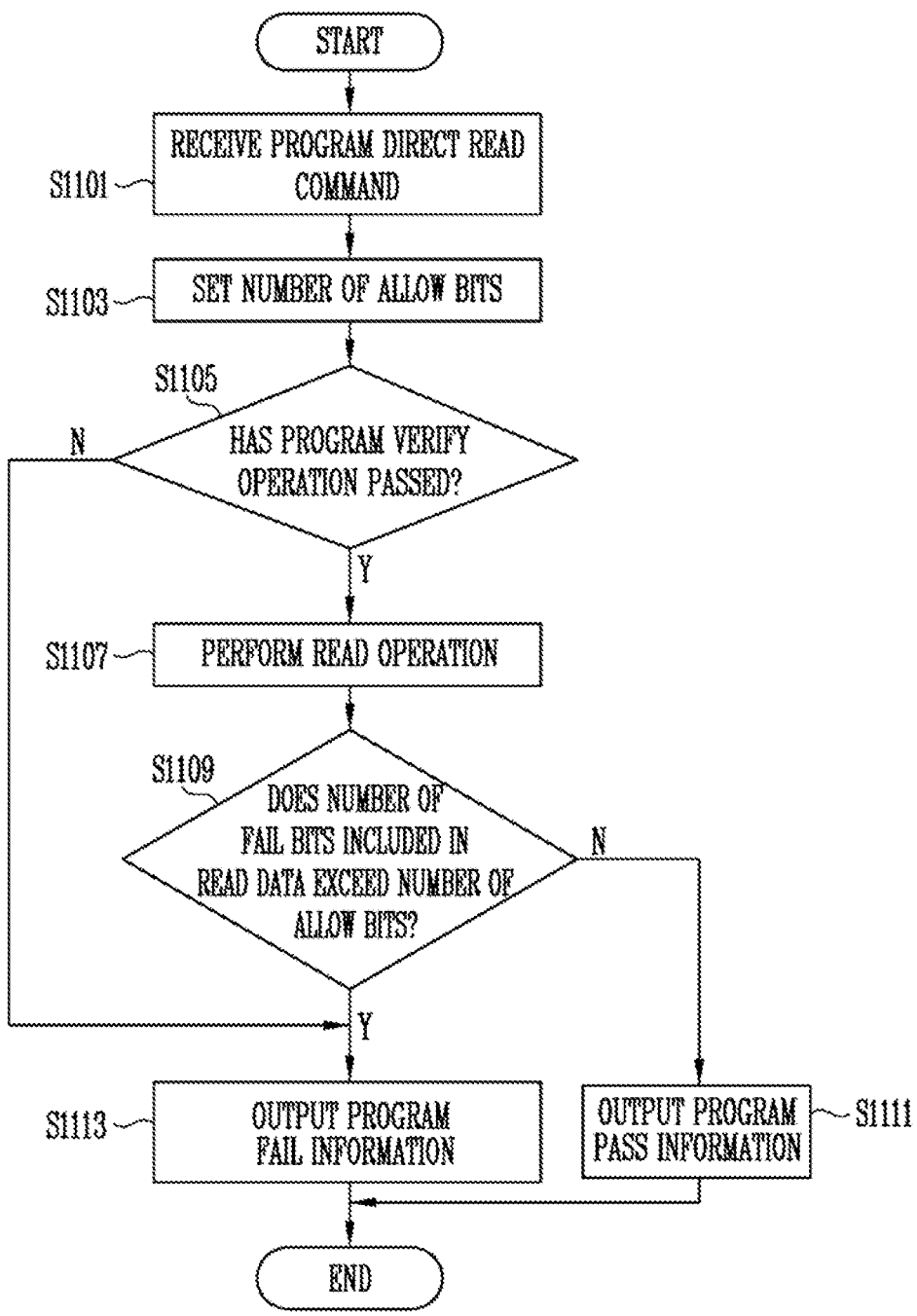

STORAGE DEVICE AND OPERATING METHOD THEREOF

CROSS-REFERENCE TO RELATED APPLICATION

The present application is a divisional application of U.S. patent application Ser. No. 16/661,828, filed on Oct. 23, 2019, and claims priority under 35 U.S.C. § 119(a) to Korean patent application number 10-2019-0062715, filed on May 28, 2019, in the Korean Intellectual Property Office, the entire disclosure of which is incorporated herein by reference.

BACKGROUND

1. Technical Field

The present disclosure generally relates to an electronic device, and more particularly, to a storage device and an operating method thereof.

2. Related Art

A storage device is a device configured to store data under the control of a host device such as a computer, a smart phone, or a smart pad. The storage device includes a device configured to store data on a magnetic disk, such as a Hard Disk Drive (HDD), and a device configured to store data in semiconductor memory, i.e., nonvolatile memory, such as a Solid State Drive (SSD) or a memory card.

The storage device may include a memory device configured to store data and a memory controller configured to control the memory device. The memory device may be classified as a volatile memory device or a nonvolatile memory device. A nonvolatile memory device may be a Read Only Memory (ROM), a Programmable ROM (PROM), an Electrically Programmable ROM (EPROM), an Electrically Erasable and Programmable ROM (EEPROM), a flash memory, a Phase-change RAM (PRAM), a Magnetic RAM (MRAM), a Resistive RAM (RRAM), a Ferroelectric RAM (FRAM), and the like.

SUMMARY

Various embodiments provide a storage device for performing a read operation together with a program operation and an operating method of the storage device.

In accordance with an embodiment of the present disclosure is a storage device including a memory device for storing data and a memory controller for controlling the memory device. The memory device includes an allow bit setting register configured to store allow bits which are compared with fail bits included in read data read in a read operation and includes a read operation controller configured to control the memory device to immediately perform the read operation after a program operation. The memory controller includes: a command generator configured to generate a command instructing the memory device to perform an operation; a bad block processor configured to set a bad block, based on a result of the read operation performed by the memory device; and a fail information controller configured to set an operation mode of a next read operation, based on the result of the read operation performed by the memory device.

In accordance with another embodiment of the present disclosure is a method for operating a storage device including a memory device for storing data and a memory controller for controlling the memory device. The method includes: performing, by the memory device, a program verify operation after a program operation; reading data programmed in the memory device, when the program verify operation passes; determining, by the memory device, a passing or failure of the program operation, based on read data obtained by reading the data programmed in the memory device; and outputting, by the memory device, program pass information or program fail information to the memory controller, based on the determined passing or failure, respectively, result of the program operation.

BRIEF DESCRIPTION OF THE DRAWINGS

Example embodiments are described in detail with reference to the accompanying drawings; however, they may be embodied in different forms and should not be construed as being limited to the embodiments set forth herein. Rather, these embodiments are provided so that this disclosure will be enabling to those skilled in the art.

In the drawing figures, dimensions may be exaggerated for clarity of illustration. It will be understood that when an element is referred to as being "between" two elements, it can be the only element between the two elements, or one or more intervening elements may also be present. Like reference numerals refer to like elements throughout.

FIGS. 10A and 10B illustrate a logical page read in a program scheme of a quadruple level cell.

FIG. 11 is a diagram illustrating an operation of a memory controller in accordance with an embodiment of the present disclosure.

DETAILED DESCRIPTION

Figure 1:
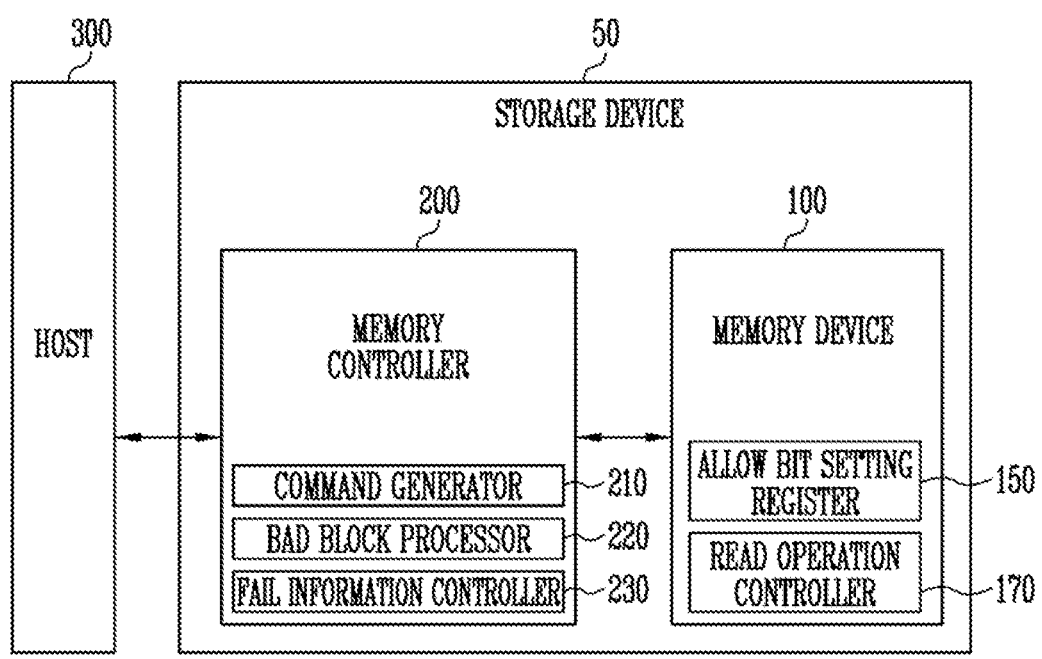
FIG. 1 is a block diagram illustrating a storage device.

The specific structural and functional descriptions disclosed herein are merely illustrative for the purpose of describing embodiments according to the concept of the present disclosure. The embodiments according to the concept of the present disclosure can be implemented in various forms and should not be construed as being limited to the embodiments set forth herein.

The embodiments according to the concept of the present disclosure can be variously modified and have various shapes. Thus, the embodiments are illustrated in the drawings and are intended to be described herein in detail. However, the embodiments according to the concept of the present disclosure are not construed as limited to specified disclosures, and include all changes, equivalents, or substitutes that do not depart from the spirit and technical scope of the present disclosure.

While terms such as "first" and "second" may be used to describe various components, such components should not be understood as being limited to the above terms. The above terms are used only to distinguish one component from another. For example, a first component may be referred to as a second component without departing from the scope of rights of the present disclosure, and likewise a second component may be referred to as a first component.

It will be understood that when an element is referred to as being "connected" or "coupled" to another element, it can be directly connected or coupled to the other element or intervening elements may also be present. In contrast, when an element is referred to as being "directly connected" or "directly coupled" to another element, no intervening elements are present. Meanwhile, other expressions describing relationships between components such as "~ between," "immediately ~between" or "adjacent to ~" and "directly adjacent to ~" may be construed similarly.

The terms used in the present application are merely used to describe particular embodiments, and are not intended to limit the present disclosure. Singular forms in the present disclosure are intended to include the plural forms as well, unless the context clearly indicates otherwise. It will be further understood that terms such as "including" or "having," etc., are intended to indicate the existence of the features, numbers, operations, actions, components, parts, or combinations thereof disclosed in the specification, and are not intended to preclude the possibility that one or more other features, numbers, operations, actions, components, parts, or combinations thereof may exist or may be added.

So far as not being differently defined, all terms used herein including technical or scientific terminologies have meanings that they are commonly understood by those skilled in the art to which the present disclosure pertains. The terms having the definitions as defined in the dictionary should be understood such that they have meanings consistent with the context of the related technique. So far as not being clearly defined in this application, terms should not be understood in an ideally or excessively formal way.

In describing those embodiments, descriptions are omitted for techniques that are well known to the art to which the present disclosure pertains, and are not directly related to the present disclosure. This intends to disclose the gist of the present disclosure more clearly by omitting unnecessary description.

Hereinafter, embodiments of the present disclosure are described in detail with reference to the accompanying drawings in order for those skilled in the art to be able to readily implement the technical spirit of the present disclosure.

FIG. 1 is a block diagram illustrating a storage device.

Referring to FIG. 1, the storage device 50 may include a memory device 100 and a memory controller 200.

The storage device 50 may be a device for storing data under the control of a host 300, such as a mobile phone, a smart phone, an MP3 player, a laptop computer, a desktop computer, a game console, a TV, a tablet PC, or an in-vehicle infotainment.

The storage device 50 may be manufactured as any one of various types of storage devices according to a host interface that is a communication scheme with the host 300. For example, the storage device 50 may be implemented with any one of a variety of types of storage devices, such as a Solid State Drive (SSD), a Multi-Media Card (MMC), an Embedded MMC (eMMC), a Reduced Size MMC (RS-MMC), a micro-MMC (micro-MMC), a Secure Digital (SD) card, a mini-SD card, a micro-SD card, a Universal Serial Bus (USB) storage device, a Universal Flash Storage (UFS) device, a Compact Flash (CF) card, a Smart Media Card (SMC), a memory stick, and the like.

The storage device 50 may be manufactured as any one of various kinds of package types. For example, the storage device 50 may be manufactured as any one of various kinds of package types, such as a Package-On-Package (POP), a System-In-Package (SIP), a System-On-Chip (SOC), a Multi-Chip Package (MCP), a Chip-On-Board (COB), a Wafer-level Fabricated Package (WFP), and a Wafer-level Stack Package (WSP).

The memory device 100 may store data. The memory device 100 operates under the control of the memory controller 200. The memory device 100 may include a memory cell array including a plurality of memory cells for storing data. The memory cell array may include a plurality of memory blocks. Each memory block may include a plurality of memory cells, and the plurality of memory cells may constitute a plurality of pages. In an embodiment, the page may be a unit for storing data in the memory device 100 or reading data stored in the memory device 100. The memory block may be a unit for erasing data.

The memory device 100 may include an allow bit setting register 150. The allow bit setting register 150 may store an allow bit. The allow bit may be a bit compared with a fail bit included in read data obtained by reading program data after a program operation. For example, a pass or fail result of the read data may be changed depending on a number of allow bits stored in the allow bit setting register 150.

When the memory device 100 receives a program direct read command, an allow bit stored in the allow bit setting register 150 may be provided to a sensing circuit. The program direct read command may be a command instructing the memory device 100 to autonomously perform a read operation of a page on which a program verify operation has passed, when the program verify operation passes in the memory device 100, and finally determine the passing or failure of a program operation, based on data read in the read operation.

Therefore, the sensing circuit may determine that the program operation has failed or passed, by comparing a number of fail bits included in the read data and a number of allow bits included in the read data. That is, the sensing circuit may output a program pass signal or program fail signal by comparing the number of fail bits included in the read data and the number of allow bits included in the read data.

In an embodiment, when a number of times the program operation fails increases, the number of allow bits stored in the allow bit setting register 150 may be changed.

The memory device 100 may include a read operation controller 170. The read operation controller 170 may control a read operation of the memory device 100. Specifically, if a program verify operation passes when the memory device 100 executes a program direct read command in accordance with the present disclosure, the read operation controller 170 may control the memory device 100 to immediately perform a read operation. That is, the memory device 100 does not output a signal according to the program verify operation to the memory controller 200, but may read programmed data. In the present disclosure, program pass or program fail may be determined based on the read data.

In an embodiment, the memory device 100 may be a Double Data Rate Synchronous Dynamic Random Access Memory (DDR SDRAM), a Low Power Double Data Rate 4 (LPDDR4) SDRAM, a Graphics Double Data Rate (GDDR) SRAM, a Low Power DDR (LPDDR), a Rambus Dynamic Random Access Memory (RDRAM), a NAND flash memory, a vertical NAND flash memory, a NOR flash memory, a Resistive Random Access Memory (RRAM), a Phase-Change Random Access Memory (PRAM), a Magnetoresistive Random Access Memory (MRAM), a Ferroelectric Random Access Memory (FRAM), a Spin Transfer Torque Random Access Memory (STT-RAM), or the like. In this specification, for convenience of description, a case where the memory device 100 is a NAND flash memory is assumed and described.

In an embodiment, the memory device 100 may be implemented as a two-dimensional array structure or three-dimensional array structure. Hereinafter, a case where the memory device 100 is implemented as the three-dimensional array structure is described as an embodiment, the present disclosure is not limited to the three-dimensional array structure. The present disclosure may be applied to not only a flash memory device in which a charge storage layer is configured with a Floating Gate (FG) but also a Charge Trap Flash (CTF) in which a charge storage layer is configured with an insulating layer.

In an embodiment, the memory device 100 may be operated using a Single-Level Cell (SLC) scheme in which one data bit is stored in one memory cell. Alternatively, the memory device 100 may be operated using a scheme in which at least two data bits are stored in one memory cell. For example, the memory cell 100 may be operated using a Multi-Level Cell (MLC) scheme in which two data bits are stored in one memory cell, a Triple-Level Cell (TLC) scheme in which three data bits are stored in one memory cell, or a Quadruple-Level Cell (QLC) scheme in which four data bits are stored in one memory cell.

The memory device 100 is configured to receive a command and an address from the memory controller 200 and access an area selected by the address in the memory cell array. That is, the memory device 100 may perform an operation corresponding to the command on the area selected by the address. For example, the memory device 100 may perform a write (program) operation, a read operation, and an erase operation according to the received command. For example, when a program command is received, the memory device 100 may program data in the area selected by the address. When a read command is received, the memory device 100 may read data from the area selected by the address. When an erase command is received, the memory device 100 may erase data stored in the area selected by the address.

The memory controller 200 may include a command generator 210. The command generator 210 may receive a request from the host 300. The request received from the host 300 may be a program (write) request, a read request, or an erase request. The command generator 210 may generate a command corresponding to the request received from the host 300.

In the present disclosure, the host 300 may output, to the memory controller 200, a program direct read request for immediately reading programmed data after the memory device 100 passes a program verify operation. After the memory controller 200 receives the program direct read request, the memory controller 200 may generate a program direct read command corresponding to the program direct read request.

The memory controller 200 may include a bad block processor 220. The bad block processor 220 may receive program pass information or program fail information from the memory device 100. The program pass information or program fail information may be a response to the program direct read command. When the bad block processor 220 receives the program fail information, the bad block processor 220 may process, as a bad block, a memory block including program-fail memory cells corresponding to the program fail information.

In an embodiment, after the bad block processor 220 processes the memory block including the program-fail memory cells as the bad block, the bad block processor 220 may generate bad block information on the memory block processed as the bad block. The generated bad block information may be provided to the command generator 210. The bad block information may include an address of the memory block processed as the bad block.

The memory controller 200 may include a fail information controller 230. The fail information controller 230 may receive program pass information or program fail information from the memory device 100. The fail information controller 230 may count a count value by accumulating a number of times program fail information is received whenever the program fail information is received. When the count value exceeds a reference value, the fail information controller 230 may reset a number of allow bits, select another circuit included in the sensing circuit, or change a page to be read. When the count value exceeds the reference value, the fail information controller 230 may re-count a number of times program fail information is received from '1.'

The memory controller 200 may control overall operations of the storage device 50.

When a power voltage is applied to the storage device 50, the memory controller 200 may execute firmware (FW). When the memory device 100 is a flash memory device, the memory controller 200 may execute FW such as a flash translation layer (FTL) for controlling communication between the host 300 and the memory device 100.

In an embodiment, the memory controller 200 may receive data and a Logical Block Address (LBA) from the host 300, and translate the LBA into a Physical Block Address (PBA) representing addresses of memory cells included in the memory device 100 in which data is to be stored. Also, the memory controller 200 may store, in a buffer memory, a logical-physical address mapping table that establishes a mapping relationship between the LBA and the PBA.

The memory controller 200 may control the memory device 100 to perform a program operation, a read operation, an erase operation, or the like in response to a request from the host 300. For example, when a program request is received from the host 300, the memory controller 200 may change the program request into a program command, and provide the memory device 100 with the program command, a PBA, and data. When a read request is received together with an LBA from the host 300, the memory controller 200 may change the read request into a read command, select a PBA corresponding to the LBA, and then provide the memory device 100 with the read command and the PBA. When an erase request is received together with an LBA from the host 300, the memory controller 200 may change the erase request into an erase command, select a PBA corresponding to the LBA, and then provide the memory device 100 with the erase command and the PBA.

In an embodiment, the memory controller 200 may autonomously generate a program command, an address, and data without any request from the host 300, and transmit the program command, the address, and the data to the memory device 100. For example, the memory controller 200 may provide the command, the address, and the data to the memory device 100 to perform background operations such as a program operation for wear leveling and a program operation for garbage collection.

In an embodiment, the storage device 50 may further include a buffer memory (not shown). The memory controller 200 may control data exchange between the host 300 and the buffer memory. Alternatively, the memory controller 200 may temporarily store system data for controlling the memory device 100 in the buffer memory. For example, the memory controller 200 may temporarily store data input from the host 300 in the buffer memory, and then transmit the data temporarily stored in the buffer memory to the memory device 100.

In various embodiments, the buffer memory may be used as a working memory or cache memory of the memory controller 200. The buffer memory may store codes or commands executed by the memory controller 200. Alternatively, the buffer memory may store data processed by the memory controller 200.

In an embodiment, the buffer memory may be implemented with a Dynamic Random Access Memory (DRAM) such as a Double Data Rate Synchronous DRAM (DDR SDRAM), a DDR4 SDRAM, a Low Power Double Data Rate 4 (LPDDR4) SDRAM, a Graphics Double Data Rate (GDDR) SRAM, a Low Power DDR (LPDDR), or a Rambus Dynamic Random Access Memory (RDRAM), or a Static Random Access Memory (SRAM).

In various embodiments, the buffer memory may be coupled to the storage device 50 at the outside of the storage device 50. Therefore, volatile memory devices 100 coupled to the storage device 50 at the outside of the storage device 50 may perform functions of the buffer memory.

In an embodiment, the memory controller 200 may control at least two memory devices 100. The memory controller 200 may control the memory devices according to an interleaving scheme so as to improve operational performance.

The host 300 may communicate with the storage device 50 using at least one of various communication protocols, such as a Universal Serial bus (USB), a Serial AT Attachment (SATA), a High Speed InterChip (HSIC), a Small Computer System Interface (SCSI), Firewire, a Peripheral Component Interconnection (PCI), a PCI express (PCIe), a Non-Volatile Memory express (NVMe), a Universal Flash Storage (UFS), a Secure Digital (SD), a Multi-Media Card (MMC), an embedded MMC (eMMC), a Dual In-line Memory Module (DIMM), a Registered DIMM (RDIMM), and a Load Reduced DIMM (LRDIMM).

Figure 2:
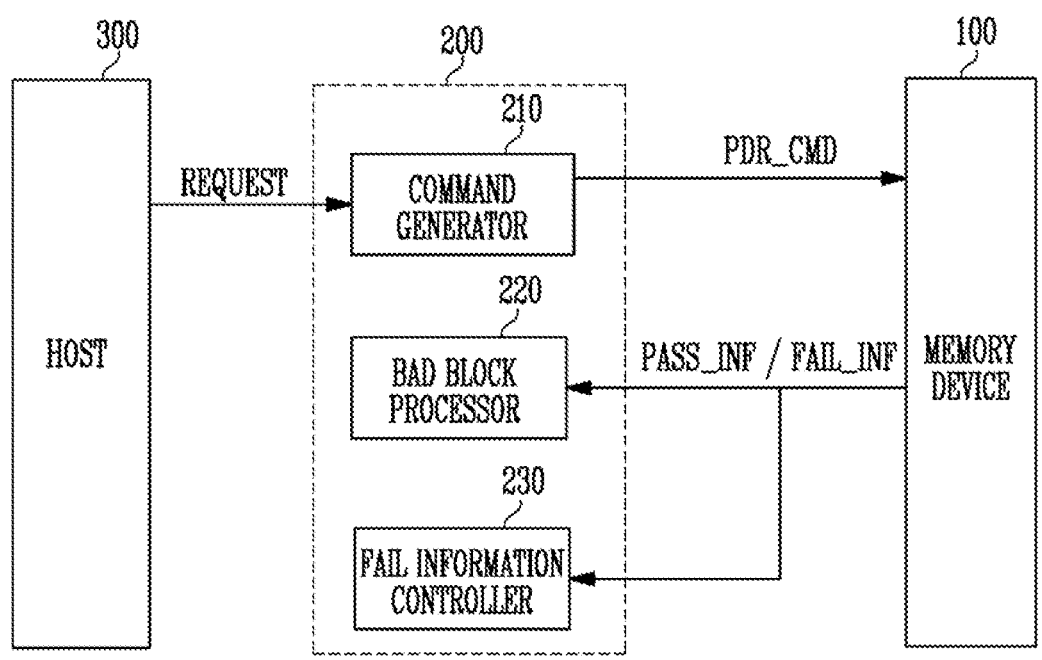
FIG. 2 is a diagram illustrating a structure of a memory controller shown in FIG. 1 and a program direct read command.

FIG. 2 is a diagram illustrating a structure of the memory controller 200 shown in FIG. 1 and a program direct read command.

Referring to FIG. 2, the memory controller 200 may include a command generator 210, a bad block processor 220, and a fail information controller 230.

In an embodiment, the memory controller 200 may receive a request REQUEST from the host 300. The request REQUEST received from the host 300 may vary, such as a program request, a read request, and an erase request.

In the present disclosure, the command generator 210 may receive a new request from the host 300. The new request may be a program direct read request for requesting the memory device 100 to immediately read programmed data when a program verify operation passes. When the command generator 210 receives the program direct read request from the host 300, the command generator 210 may generate a program direct read command PDR_CMD corresponding to the program direct read request and output the program direct read command PDR_CMD to the memory device 100.

The program direct read command PDR_CMD may be a command instructing the memory device 100 to determine the passing or failure of a program operation, based on read data obtained by reading programmed data, when a program verify operation passes after the memory device 100 performs the program operation.

In an embodiment, when the memory device 100 receives the program direct read command PDR_CMD from the command generator 210, the memory device 100 may perform an operation corresponding to the program direct read command PDR_CMD.

Specifically, the memory device 100 may set a number of allow bits to be compared with a number of fail bits included in data read in response to the program direct read command PDR_CMD, and output program pass information PASS_INF or program fail information FAIL_INF by comparing the number of fail bits included in the read data and the number of allow bits.

In an embodiment, the bad block processor 220 may receive program pass information PASS_INF or program fail information FAIL_INF. The program pass information PASS_INF may be output from the memory device 100 when the number of fail bits included in the read data is equal to or smaller than the number of allow bits. On the contrary, the program fail information FAIL_INF may be output from the memory device 100 when the number of fail bits included in the read data exceeds the number of allow bits.

When the bad block processor 220 receives the program pass information PASS_INF, the bad block processor 220 might not operate. However, when the bad block processor 220 receives program fail information FAIL_INF, the bad block processor 220 may process, as a bad block, a memory block including program-fail memory cells. In an embodiment, when the bad block processor 220 records that the corresponding memory block is a bad block in a bad block management table (not shown) in the memory controller 200, the memory block 200 might not output an address corresponding to the memory block recorded in the bad block management table.

In an embodiment, the fail information controller 230 may receive program pass information PASS_INF or program fail information FAIL_INF. The fail information controller 230 may accumulate and count a number of times program fail information FAIL_INF is received whenever the program fail information FAIL_INF is received. When the number of times the program fail information FAIL_INF is received exceeds a reference number of times, the fail information controller 230 may change an operation mode of the memory device 100.

Specifically, the fail information controller 230 may control the memory device 100 to change a number of allow bits stored in the allow bit setting register 150 shown in FIG. 1, which is included in the memory device 100. Alternatively, the fail information controller 230 may control the memory device 100 to select a Current Sensing Circuit (CSC) from the CSC and a Fail Bit Counter (FBC), which are included in the sensing circuit. Alternatively, the fail information controller 230 may control the memory device to select a page to be read, when the memory device 100 performs an operation corresponding to the program direct read command PDR_CMD.

Figure 3:
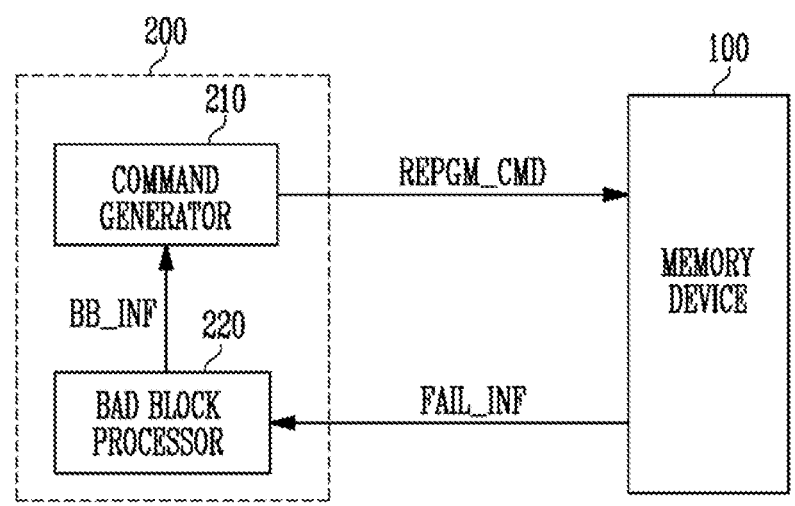
FIG. 3 is a diagram illustrating an operation of the memory controller after fail information is received.

FIG. 3 is a diagram illustrating an operation of the memory controller 200 after fail information is received.

Referring to FIG. 3, the memory controller 200 shown in FIG. 3 may include a command generator 210 and the bad block processor 220. FIG. 3 illustrates a case where the fail information controller 230 shown in FIG. 2 is omitted from among the components of the memory controller 200 shown in FIG. 3.

FIG. 3 illustrates an operation after the memory controller 200 receives program fail information FAIL_INF in response to a program direct read command. The program fail information FAIL_INF may be output from the memory device 100 after the memory device 100 performs an operation corresponding to the program direct read command.

In an embodiment, the memory device 100 may perform a program operation, and a program verify operation may pass. After the program verify operation passes, programmed data may be read. Program fail information FAIL_INF may be output when a number of fail bits included in the read data exceeds a set number of allow bits. That is, when the program verify operation passes, the memory device 100 may immediately read the programmed data, meaning the memory device 100 may read the programmed data without outputting a response representing that the program operation has been completed. Also, the memory device 100 may output program pass information or program fail information FAIL_INF without outputting the read data to the memory controller 200.

In an embodiment, the bad block processor 220 may receive program fail information FAIL_INF from the memory device 100. The program fail information FAIL_INF may include information representing that a number of fail bits included in read data obtained by reading programmed data has exceeded a number of allow bits.

The bad block processor 220 may perform an operation of processing a memory block including a read page as a bad block, based on the program fail information FAIL_INF. That is, the bad block processor 220 may record the corresponding memory block in a bad block management table (not shown) and not allow an address corresponding to the corresponding memory block to be output.

In an embodiment, the bad block processor 220 may generate bad block information BB_INF, based on the program fail information FAIL_INF. The bad block information BB_INF may include information on a memory block including a page read according to the program direct read command. That is, the bad block processor 220 may process the memory block including the read page as a bad block, and generate bad block information BB_INF including information on the memory block processed as the bad block. The generated bad block information BB_INF may be provided to the command generator 210.

When the command generator 210 receives the bad block information BB_INF from the bad block processor 220, the command generator 210 may output a reprogram command REPGM_CMD to the memory device 100. That is, because a program operation has not been completed as a memory block including a page on which the program operation is performed is processed as a bad block even though the memory device 100 has performed the program operation, based on the program direct read command, the command generator 210 may output a reprogram command REPGM_CMD for re-programming data to the memory device 100.

When the memory device 100 receives the reprogram command REPGM_CMD from the memory controller 200, the memory device may re-perform the program operation, based on program data stored in a latch included in a page buffer group according to the reprogram command REPGM_CMD.

Figure 4:
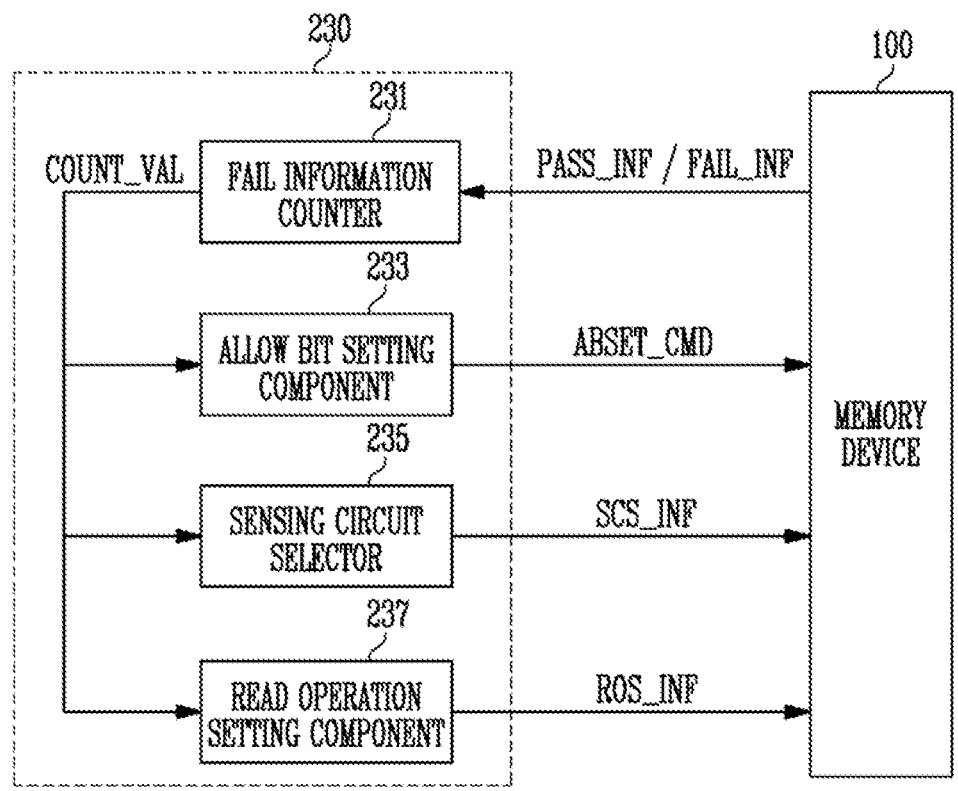
FIG. 4 is a diagram illustrating an operation of the memory controller when a count value obtained by counting a number of times fail information is received exceeds a reference value.

FIG. 4 is a diagram illustrating an operation of the memory controller when a count value obtained by counting a number of times fail information is received exceeds a reference value.

Referring to FIG. 4, the fail information controller 230 shown in FIG. 4 may include a fail information counter 231, an allow bit setting component 233, a sensing circuit selector 235, and a read operation setting component 237.

In an embodiment, the fail information counter 231 may receive program pass information PASS_INF or program fail information FAIL_INF from the memory device 100. The program pass information PASS_INF or program fail information FAIL_INF may be a response to the program direct read command received by the memory device 100. The program pass information PASS_INF may be output from the memory device 100 when a number of fail bits included in read data is equal to or smaller than a number of allow bits. On the contrary, the program fail information FAIL_INF may be output from the memory device 100 when the number of fail bits included in read data exceeds the number of allow bits.

In an embodiment, the fail information counter 231 may count a number of times program fail information FAIL_INF is received whenever the program fail information FAIL_INF is received from the memory device 100. That is, the fail information counter 231 may accumulate and count the number of times the program fail information FAIL_INF is received.

The fail information counter 231 may generate a count value COUNT_VAL by counting the number of times the program fail information FAIL_INF is received. When the generated count value COUNT_VAL exceeds a reference value, the fail information counter 231 may output the count value COUNT_VAL to at least one of the allow bit setting component 233, the sensing circuit selector 235, and the read operation setting component 237.

In an embodiment, the allow bit setting component 233 may receive the count value COUNT_VAL from the fail information counter 231. The allow bit setting component 233 may output an allow bit setting command ABSET_CMD for changing allow bits stored in the allow bit setting register 150 shown in FIG. 1, which is included in the memory device 100, based on the received count value COUNT_VAL.

Specifically, a case where a number of fail bits included in read data exceeds a set number may increase as a number of times the memory device 100 outputs the program fail information FAIL_INF. Under this situation, a program operation is not ended, but a reprogram operation may be repeatedly performed. Hence, it might be necessary to set the number of allow bits to be increased.

Therefore, the allow bit setting component 233 may output an allow bit setting command ABSET_CMD for setting a number of allow bits, and the memory device 100 may increase the number of allow bits stored in the allow bit setting register 150 in response to the allow bit setting command ABSET_CMD.

In an embodiment, the sensing circuit selector 235 may receive the count value COUNT_VAL from the fail information counter 231. The sensing circuit selector 235 may control a Current Sensing Circuit (CSC) among circuits included in the sensing circuit to perform a sensing operation, based on the received count value COUNT_VAL.

In an embodiment, the sensing circuit may include the CSC and/or a Fail Bit Counter (FBC). The CSC or FBC included in the sensing circuit may determine whether a number of fail bits included in sensed data exceeds a number of allow bits. In an embodiment, the CSC may perform a sensing operation, based on a reference current, and the FBC may perform a sensing operation, based on a reference voltage generated based on the reference current.

Consequently, the sensing circuit selector 235 may select the CSC having accuracy of sensed data, which is higher than that of the FBC. The sensing circuit selector 235 may output sensing circuit selection information SCS_INF to the memory device 100 such that the sensing operation is performed by the CSC. When the memory device 100 receives the sensing circuit selection information SCS, the memory device 100 may perform the sensing operation through the CSC.

In an embodiment, the read operation setting component 237 may receive the count value COUNT_VAL from the fail information counter 231. The read operation setting component 237 may set a page to be read and/or a read voltage when the program direct read command is executed, based on the received count value COUNT_VAL.

Specifically, it might be necessary to increase the accuracy of a read operation as the number of times the memory device 100 outputs the program fail information FAIL_INF increases. Therefore, the read operation setting component 237 may set the page to be read and/or the read voltage such that the memory device 100 reads another page in addition to a least significant bit page. In addition, the read operation setting component 237 may set an offset of the read voltage. That is, the read operation setting component 237 may change the read voltage.

Consequently, the read operation setting component 237 may output read operation setting information ROS_INF to the memory device 100 so as to set the page to be read and/or the read voltage when the memory device 100 executes the program direct read command.

A read page determined based on the read operation setting information ROS_INF is described in more detail with reference to FIGS. 9 and 10.

Figure 5:
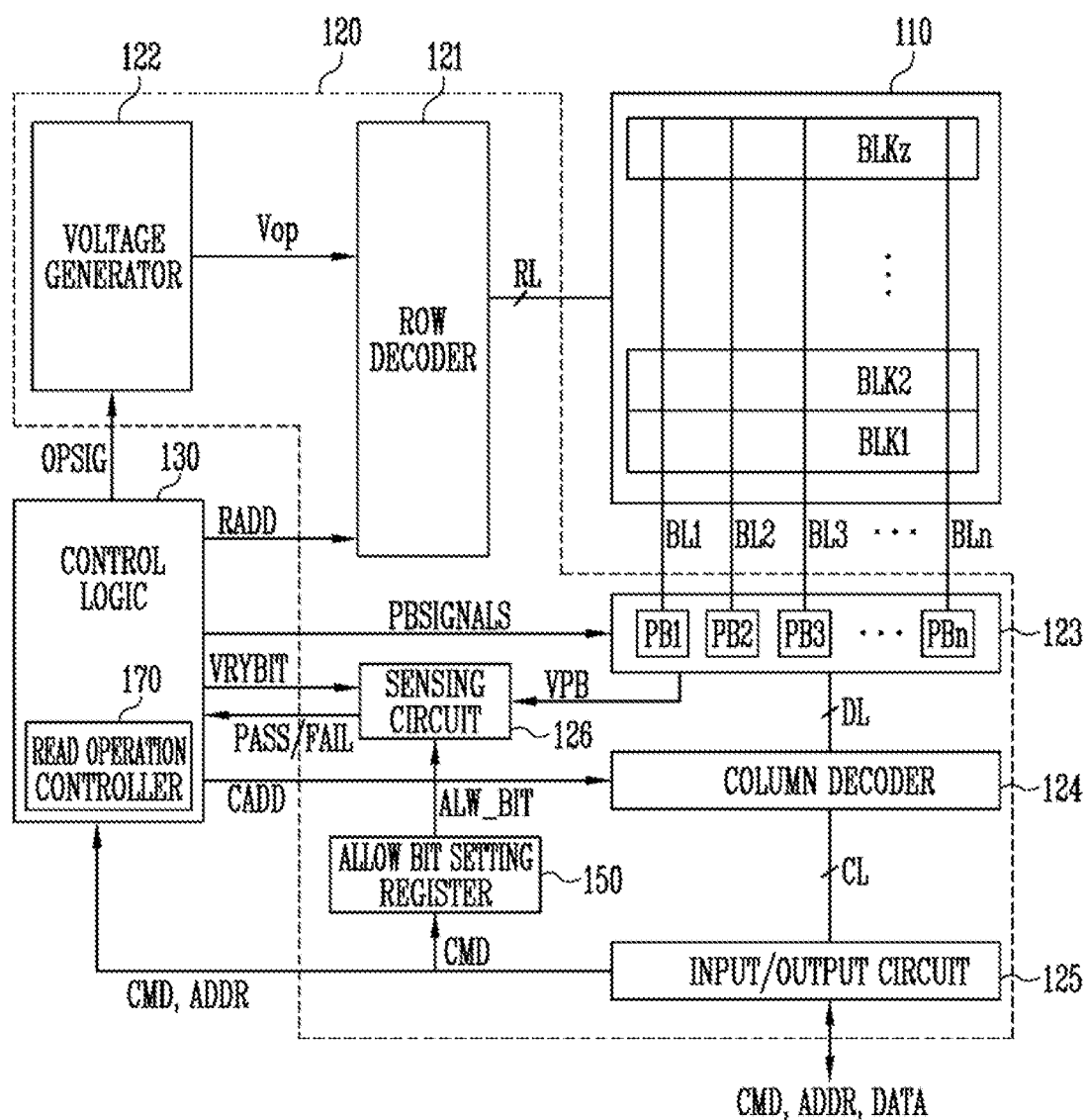
FIG. 5 is a diagram illustrating a structure of a memory device shown in FIG. 1.

FIG. 5 is a diagram illustrating a structure of the memory device shown in FIG. 1.

Referring to FIG. 5, the memory device 100 may include a memory cell array 110, a peripheral circuit 120, control logic 130, and an allow bit setting register 150.

The memory cell array 110 includes a plurality of memory blocks BLK1 to BLKz. The plurality of memory blocks BLK1 to BLKz are coupled to a row decoder 121 through row lines RL. The plurality of memory blocks BLK1 to BLKz are coupled to a page buffer group 123 through bit lines BL1 to BLn. Each of the plurality of memory blocks BLK1 to BLKz includes a plurality of memory cells. In an embodiment, the plurality of memory cells may be nonvolatile memory cells. Memory cells coupled to the same word line may be defined as one page. Therefore, one memory block may include a plurality of pages.

The row lines RL may include at least one source select line, a plurality of word lines, and at least one drain select line.

Each of the memory cells included in the memory cell array 110 may be configured as a Single-Level Cell (SLC) for storing one data bit, a Multi-Level Cell (MLC) for storing two data bits, a Triple-Level Cell (TLC) for storing three data bits, or a Quad-Level Cell (QLC) for storing four data bits.

The peripheral circuit 120 may perform a program operation, a read operation, or an erase operation on a selected region of the memory cell array 110 under the control of the control logic 130. The peripheral circuit 120 may drive the memory cell array 110. For example, the peripheral circuit 120 may apply various operating voltages to the row lines RL and the bit lines BL1 to BLn or discharge the applied voltages under the control of the control logic 130.

The peripheral circuit 120 may include the row decoder 121, the voltage generator 122, the page buffer group 123, a column decoder 124, an input/output circuit 125, a sensing circuit 126, and the allow bit setting register 150.

The row decoder 121 is coupled to the memory cell array 110 through the row lines RL. The row lines RL may include at least one source select line, a plurality of word lines, and at least one drain select line. In an embodiment, the word lines may include normal word lines and dummy word lines. In an embodiment, the row lines RL may further include a pipe select line.

The row decoder 121 decodes a row address RADD received from the control logic 130. The row decoder 121 selects at least one memory block among the memory blocks BLK1 to BLKz according to the decoded address. Also, the row decoder 121 may select at least one word line of the selected memory block to apply voltages generated by the voltage generator 122 to the at least one word line according to the decoded address.

For example, in a program operation, the row decoder 121 may apply a program voltage to the selected word line, and apply a program pass voltage having a level lower than that of the program voltage to unselected word lines. In a program verify operation, the row decoder 121 may apply a verify voltage to the selected word line, and apply a verify pass voltage having a level higher than that of the verify voltage to the unselected word lines. In a read operation, the row decoder 121 may apply a read voltage to the selected word line, and apply a read pass voltage having a level higher than that of the read voltage to the unselected word lines.

In an embodiment, an erase operation of the memory device 100 is performed in units of memory blocks. In the erase operation, the row decoder 121 may select one memory block according to the decoded address. In the erase operation, the row decoder 121 may apply a ground voltage to word lines coupled to the selected memory blocks.

The voltage generator 122 operates under the control of the control logic 130. The voltage generator 122 generates a plurality of voltages by using an external power voltage supplied to the memory device 100. Specifically, the voltage generator may generate various operating voltages Vop used in program, read, and erase operations in response to an operation signal OPSIG. For example, the voltage generator 122 may generate a program voltage, a verify voltage, a pass voltage, a read voltage, an erased voltage, and the like under the control of the control logic 130.

In an embodiment, the voltage generator 122 may generate an internal power voltage by regulating the external power voltage. The internal power voltage generated by the voltage generator 122 is used as an operation voltage of the memory device 100.

In an embodiment, the voltage generator 122 may generate a plurality of voltages by using the external power voltage or the internal power voltage.

For example, the voltage generator 122 may include a plurality of pumping capacitors for receiving the internal power voltage, and generate the plurality of voltages by selectively activating the plurality of pumping capacitors under the control of the control logic 130.

The plurality of generated voltages may be supplied to the memory cell array 110 by the row decoder 121.

The page buffer group 123 includes first to nth page buffers PB1 to PBn. The first to nth page buffers PB1 to PBn are coupled to the memory cell array 110 respectively through first to nth bit lines BL1 to BLn. The first to nth bit lines BL1 to BLn operate under the control of the control logic 130. Specifically, the first to nth bit lines BL1 to BLn may operate in response to page buffer control signals PBSIGNALS. For example, the first to nth page buffers PB1 to PBn may temporarily store data received through the first to nth bit lines BL1 to BLn, or sense voltages or current of the bit lines BL1 to BLn in a read or verify operation.

Specifically, in a program operation, the first to nth page buffers PB1 to PBn may transfer data DATA received through the input/output circuit 125 to selected memory cells through the first to nth bit lines BL1 to BLn, when a program voltage is applied to a selected word line. Memory cells of a selected page are programmed according to the transferred data DATA. In a program verify operation, the first to nth page buffers PB1 to PBn read page data from the selected memory cells through the first to nth bit lines BL1 to BLn.

In a read operation, the first to nth page buffers PB1 to PBn read data DATA from the memory cells of the selected page through the first to nth bit lines BL1 to BLn, and output the read data DATA to the input/output circuit 125 under the control of the column decoder 124.

In an erase operation, the first to nth page buffers PB1 to PBn may float the first to nth bit lines BL1 to BLn, or apply an erase voltage.

The column decoder 124 may communicate data between the input/output circuit 125 and the page buffer group 123 in response to a column address CADD. For example the column decoder 124 may communicate data with the first to nth page buffers PB1 to PBn through data lines EL, or communicate data with the input/output circuit 125 through column lines CL.

The input/output circuit 125 may transfer a command CMD and an address ADDR, which are received from the controller 2000 described with reference to FIG. 1, to the control logic 130, or communicate data DATA with the column decoder 124.

In a read operation or verify operation, the sensing circuit 125 may generate a reference current in response to an allow bit VRYBIT signal, and output a pass or fail signal PASS/FAIL by comparing a sensing voltage VPB received from the page buffer group 123 and a reference voltage generated by the reference current.

The control logic 130 may control the peripheral circuit 120 by outputting the operation signal OPSIG, the row address RADD, the page buffer control signals PBSIGNALS, and the allow bit VRYBIT in response to the command CMD and the address ADDR. Also, the control logic 130 may determine whether the verify operation has passed or failed in response to the pass or fail signal PASS/FAIL. The control logic 130 may be implemented as hardware, software, or a combination of hardware and software. For example, the control logic 130 may be a control logic circuit operating in accordance with an algorithm and/or a processor executing control logic code.

Each of the memory cells included in the memory cell array 110 may be programmed to any one program state among a plurality of program states according to data stored therein. A target program state of a memory cell may be determined as any one of the plurality of program states according to data stored in the memory cell.

In an embodiment, the control logic 130 may include a read operation controller 170. The read operation controller 170 may control the memory device 100 to perform a read operation after a program verify operation passes in a program operation.

Specifically, a program operation may be performed when the memory device 100 performs an operation the program direct read command of the present disclosure. When the program verify operation passes after the program operation is performed, the control logic 130 does not output information representing that the program verify operation has passed to the memory controller 200 shown in FIG. 1, but may control the memory device 100 to perform a read operation. That is, the read operation controller 170 may control the memory device 100 to read programmed data after the program verify operation passes.

The programmed data may be read, and the control logic 130 may receive a pass signal or fail signal according to whether a number of fail bits included in the read data exceeds a number of allow bits. When the number of fail bits included in the read data exceeds the number of allow bits, the control logic 130 may output program fail information representing that the program operation has failed. On the contrary, when the number of fail bits included in the read data is smaller than the number of allow bits, the control logic 130 may output program pass information representing that the program operation has passed.

Although the read operation of reading the programmed data has been performed, the control logic 130 may output program fail information. That is, the control logic 130 does not output the read data to the memory controller, but may output program fail information or program pass information to the memory controller.

In an embodiment, an allow bit ALW_BIT compared with a fail bit included in the read data may be received from the allow bit setting register 150.

The allow bit setting register 150 may store the allow bit ALW_BIT compared with the fail bit included in the read data.

In an embodiment, the allow bit setting register 150 may receive a command CMD from the input/output circuit 125. When the command CMD received from the input/output circuit 125 is the program direct read command of the present disclosure, the allow bit ALW_BIT stored in the allow bit setting register 150 may be output to the sensing circuit 126.

In an embodiment, the allow bit ALW_BIT stored in the allow bit setting register 150 may be output to the sensing circuit 126 in response to the program direct read command. A bit processed as program fail in a sensing operation may be changed based on the allow bit ALW_BIT output to the sensing circuit 126.

Specifically, because the control logic 130 determines the passing or failure of the program operation, based on the read data, it might be necessary to set the allow bit ALW_BIT to be increased, as compared with when a normal read operation is performed. That is, in order to prevent the program operation from being repeatedly performed without being ended, it might be necessary to set the allow bit ALW_BIT to be increased. Therefore, the sensing circuit 126 may determine whether the fail bit included in the read data has exceeded the allow bit ALW_BIT, based on the allow bit ALW_BIT stored in the allow bit setting register 150.

In an embodiment, the allow bit ALW_BIT stored in the allow bit setting register 150 may be changed based on an allow bit setting command received from the memory controller. That is, the allow bit setting register 150 may receive the allow bit setting command so as to set the allow bit ALW_BIT to be increased as a number of times program fail information is output from the memory device 100 increases. The allow bit setting register 150 may set the number of allow bits to be greater than the existing number of allow bits. Subsequently, the allow bit setting register 150 may output the changed allow bit ALW_BIT to the sensing circuit 126, when an operation corresponding to the program direct read command is performed.

Figure 6:
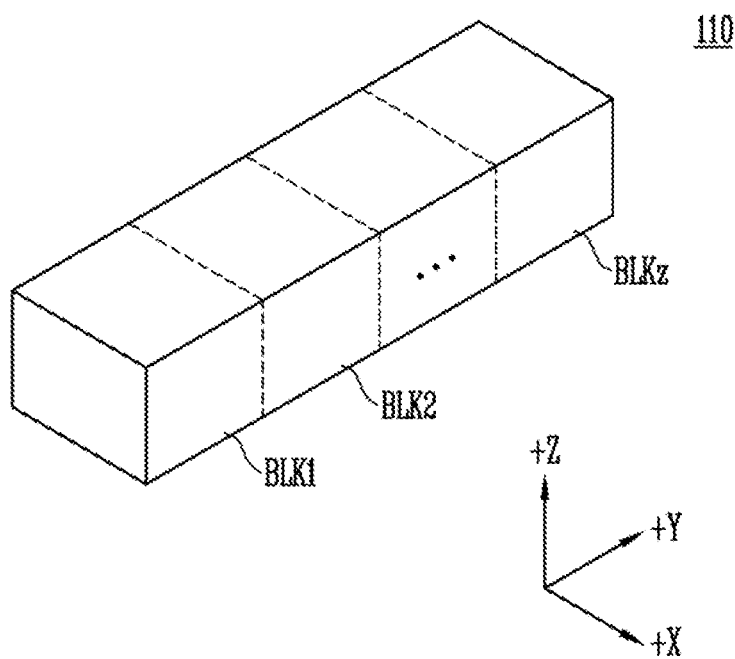
FIG. 6 is a diagram illustrating an embodiment of a memory cell array shown in FIG. 5.

FIG. 6 is a diagram illustrating an embodiment of the memory cell array shown in FIG. 5.

Referring to FIG. 6, the memory cell array 110 may include a plurality of memory blocks BLK1 to BLKz. Each memory block may have a three-dimensional structure. Each memory block may include a plurality of memory cells stacked on a substrate (not shown). The plurality of memory cells may be arranged along +X, +Y, and +Z directions. A structure of each memory block is described in more detail with reference to FIGS. 7 and 8.

Figure 7:
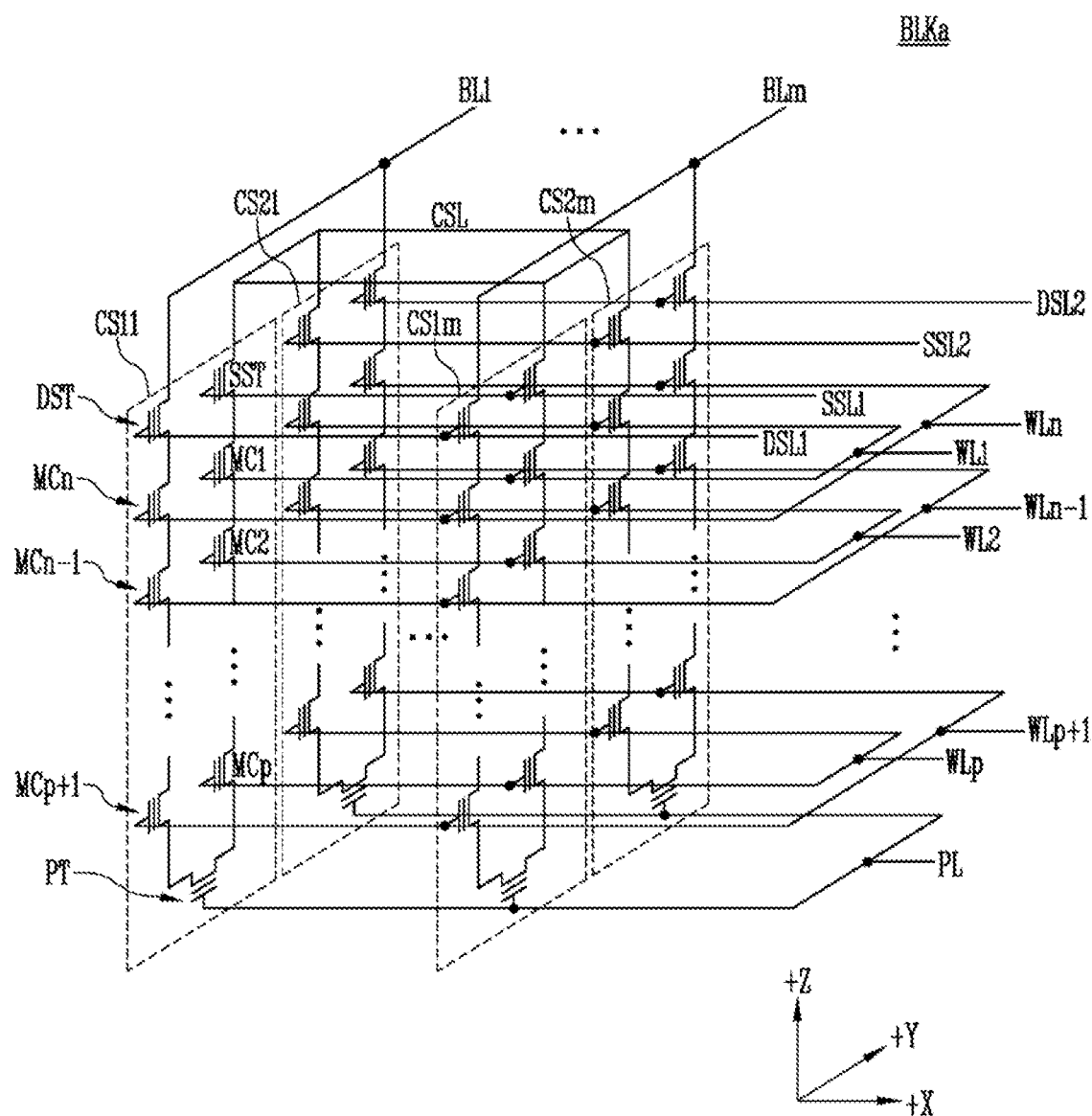
FIG. 7 is a circuit diagram illustrating any one memory block among memory blocks shown in FIG. 6.

FIG. 7 is a circuit diagram illustrating any one memory block BLKa among the memory blocks BLK1 to BLKz shown in FIG. 6.

Referring to FIG. 7, the memory block BLKa may include a plurality of cell strings CS11 to CS1m and CS21 to CS2m. In an embodiment, each of the plurality of cell strings CS11 to CS1m and CS21 to CS2m may be formed in a 'U' shape. In the memory block BLKa, m cell strings are arranged in a row direction (i.e., a +X direction). FIG. 7 illustrates two cell strings arranged in a column direction (i.e., a +Y direction). However, this is for convenience of description, and it will be understood that three cell strings may be arranged in the column direction.

Each of the plurality of cell strings CS11 to CS1m and CS21 to CS2m may include at least one source select transistor SST, first to nth memory cells MC1 to MCn, a pipe transistor PT, and at least one drain select transistor DST.

The source select transistor SST of each cell string is coupled between a common source line CSL and memory cells MC1 to MCp.

In an embodiment, the source select transistors of cell strings arranged on the same row are coupled to a source select line extending in the row direction, and the source select transistors of cell strings arranged on different rows are coupled to different source select lines. In FIG. 7, the source select transistors of the cell strings CS11 to CS1m on a first row are coupled to a first source select line SSL1. The source select transistors of the cell strings CS21 to CS2m on a second row are coupled to a second source select line SSL2.

In another embodiment, the source select transistors of the cell strings CS11 to CS1m and CS21 to CS2m may be commonly coupled to one source select line.

The first to nth memory cells MC1 to MCn of each cell string are coupled between the source select transistor SST and the drain select transistor DST.

The first to nth memory cells MC1 to MCn may be divided into first to pth memory cells MC1 to MCp and a (p+1)th to nth memory cells MCp+1 to MCn. The first to pth memory cells MC1 to MCp are sequentially arranged in the opposite direction of a +Z direction, and are coupled in series between the source select transistor SST and the pipe transistor PT. The (p+1)th to nth memory cells MCp+1 to MCn are sequentially arranged in the +Z direction, and are coupled in series between the pipe transistor PT and the drain select transistor DST. The first to pth memory cells MC1 to MCp and the (p+1)th to nth memory cells MCp+1 to MCn are coupled through the pipe transistor PT. Gate electrodes of the first to nth memory cells MC1 to MCn of each cell string are coupled to first to nth word lines WL1 to WLn, respectively.

A gate of the pipe transistor PT of each cell string is coupled to a pipe line PL.

The drain select transistor DST of each cell string is coupled between a corresponding bit line and the memory cells MCp+1 to MCn. Cell strings arranged in the row direction are coupled to a drain select line extending in the row direction. The drain select transistors of the cell strings CS11 to CS1m on the first row are coupled to a first drain select line DSL1. The drain select transistors of the cell strings CS21 to CS2m on the second row are coupled to a second drain select line DSL2.

Cell strings arranged in the column direction are coupled to a bit line extending in the column direction. In FIG. 7, the cell strings CS11 and CS21 on a first column are coupled to a first bit line BL1. The cell strings CS1m and CS2m on an mth column are coupled to an mth bit line BLm.

Memory cells coupled to the same word line in the cell strings arranged in the row direction constitute one page. For example, memory cells coupled to the first word line WL1 in the cell strings CS11 to CS1m on the first row constitute one page. Memory cells coupled to the first word line WL1 in the cell strings CS21 to CS2m on the second row constitute another page. As any one of the drain select lines DSL1 and DSL2 is selected, cell strings arranged in one row direction may be selected. As any one of the word lines WL1 to WLn is selected, one page may be selected in the selected cell strings.

In another embodiment, even bit lines and odd bit lines may be provided instead of the first to mth bit lines BL1 to BLm. In addition, even-numbered cell strings among the cell strings CS11 to CS1m or CS21 to CS2m arranged in the row direction may be coupled to the even bit lines, respectively, and odd-numbered cell strings among the cell strings CS11 to CS1m or CS21 to CS2m arranged in the row direction may be coupled to the odd bit lines, respectively.

In an embodiment, at least one of the first to nth memory cells MC1 to MCn may be used as a dummy memory cell. For example, the at least one dummy memory cell may be provided to decrease an electric field between the source select transistor SST and the memory cells MC1 to MCp. Alternatively, the at least one dummy memory cell may be provided to decrease an electric field between the drain select transistor DST and the memory cells MCp+1 to MCn. When the number of dummy memory cells increases, the reliability of an operation of the memory block BLKa is improved. On the other hand, the size of the memory block BLKa increases. When the number of dummy memory cells decreases, the size of the memory block BLKa decreases. On the other hand, the reliability of an operation of the memory block BLKa may be deteriorated.

In order to efficiently control the at least one dummy memory cell, the dummy memory cells may have a required threshold voltage. Before or after an erase operation of the memory block BLKa, a program operation may be performed on all or some of the dummy memory cells. When an erase operation is performed after the program operation is performed, the threshold voltage of the dummy memory cells control a voltage applied to the dummy word lines coupled to the respective dummy memory cells, so that the dummy memory cells can have the required threshold voltage.

Figure 8:
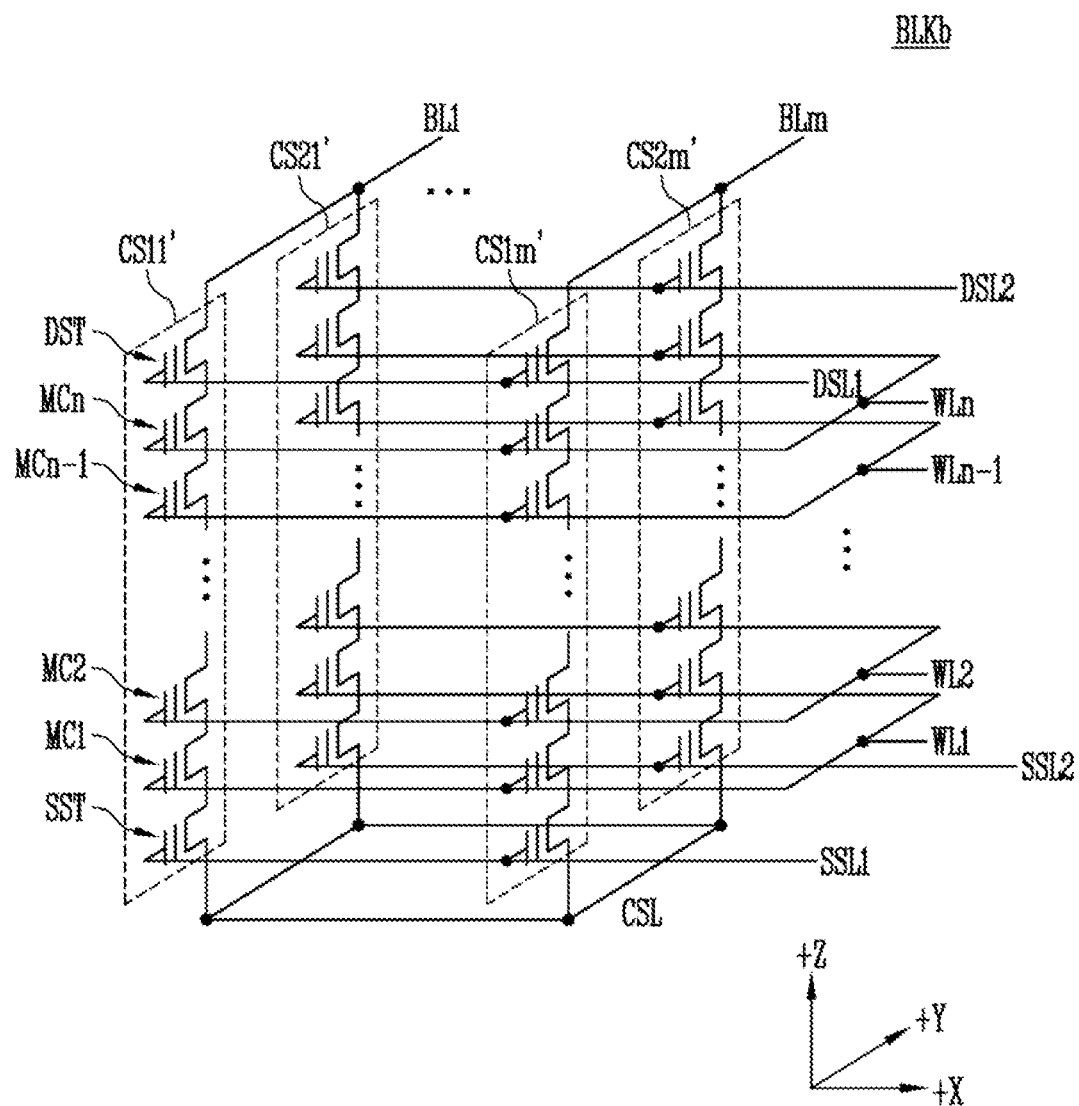
FIG. 8 is a circuit diagram illustrating another embodiment of the one memory block among the memory blocks shown in FIG. 6.

FIG. 8 is a circuit diagram illustrating another embodiment BLKb of the one memory block among the memory blocks BLK1 to BLKz shown in FIG. 6.

Referring to FIG. 8, the memory block BLKb may include a plurality of cell strings CS11' to CS1m' and CS21' to CS2m'. Each of the plurality of cell strings CS11' to CS1m' and CS21' to CS2m' extends along the +Z direction. Each of the plurality of cell strings CS11' to CS1m' and CS21' to CS2m' includes at least one source select transistor SST, first to nth memory cells MC1 to MCn, and at least one drain select transistor DST, which are stacked on a substrate (not shown) under the memory block BLKb.

The source select transistor SST of each cell string is coupled between a common source line CSL and the memory cells MC1 to MCn. The source select transistors of cell strings arranged on the same row are coupled to the same source select line. The source select transistors of the cell strings CS11' to CS1m' arranged on a first row are coupled to a first source select line SSL1. Source select transistors of the cell strings CS21' to CS2m' arranged on a second row are coupled to a second source select line SSL2. In another embodiment, the source select transistors of the cell strings CS11' to CS1m' and CS21' to CS2m' may be commonly coupled to one source select line.

The first to nth memory cells MC1 to MCn of each cell string are coupled in series between the source select transistor SST and the drain select transistor DST. Gate electrodes of the first to nth memory cells MC1 to MCn are coupled to first to nth word lines WL1 to WLn, respectively.

The drain select transistor DST of each cell string is coupled between a corresponding bit line and the memory cells MC1 to MCn. The drain select transistors of cell strings arranged in the row direction are coupled to a drain select line extending in the row direction. The drain select transistors of the cell strings CS11' to CS1m' on the first row are coupled to a first drain select line DSL1. The drain select transistors of the cell strings CS21' to CS2m' on the second row are coupled to a second drain select line DSL2.

Consequently, the memory block BLKb of FIG. 8 has a circuit similar to that of the memory block BLKa of FIG. 7, except that the pipe transistor PT is excluded from each cell string in FIG. 8.

In another embodiment, even bit lines and odd bit lines may be provided instead of the first to mth bit lines BL1 to BLm. In addition, even-numbered cell strings among the cell strings CS11' to CS1m' or CS21' to CS2m' arranged in the row direction may be coupled to the even bit lines, respectively, and odd-numbered cell strings among the cell strings CS11' to CS1m' or CS21' to CS2m' arranged in the row direction may be coupled to the odd bit lines, respectively.

Figures 9A, 9B:
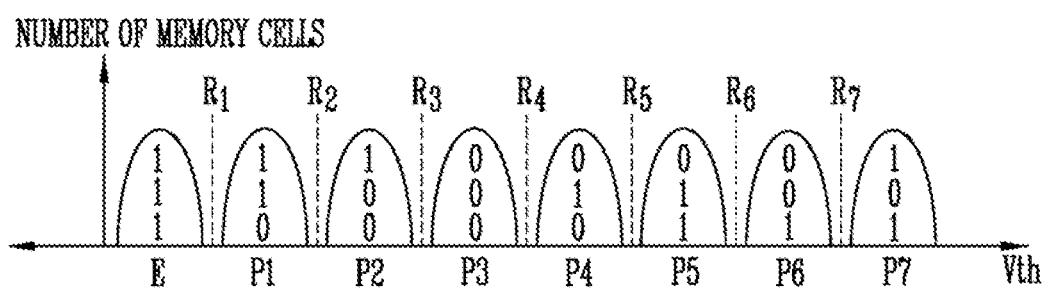
FIGS. 9A and 9B illustrate a logical page read in a program scheme of a triple level cell.

In addition, at least one of the first to nth memory cells MC1 to MCn may be used as dummy memory cells so as to decrease an electric field between the source select transistor SST and the memory cells MC1 to MCn FIGS. 9A and 9B illustrate a logical page read in a program scheme of a triple-level cell.

Referring to FIGS. 9A and 9B, FIG. 9A illustrates an erase state E and first to seventh program states P1 to P7 when the memory device 100 shown in FIG. 1 performs a program operation using a Triple Level Cell (TLC) scheme, and FIG. 9B illustrates a logical page read after the memory device 100 shown in FIG. 1 performs the program operation using the TLC scheme. The logical page may be a page read when the memory device 100 executes the program direct read command.

FIG. 9A illustrates a case where a memory cell stores data corresponding to three bits. In FIG. 9A, the horizontal axis represents threshold voltage Vth according to states of memory cells, and the vertical axis represents number of memory cells.

In FIG. 9A, a program operation using the TLC scheme in which one memory cell stores data corresponding to three bits is described as an example. Each memory cell may be programmed to have a threshold voltage corresponding to any one of the erase state E and the first to seventh program states P1 to P7. That is, the memory cell may be programmed to have a threshold voltage corresponding to any one of the erase state E, the first program state P1, the second program state P2, the third program state P3, the fourth program state P4, the fifth program state P5, the sixth program state P6, and the seventh program state P7. Memory cells may have a threshold voltage distribution corresponding to the erase state E before the program operation is performed.

The erase state E may correspond to data '111,' the first program state P1 may correspond to data '110,' the second program state P2 may correspond to data '100,' the third program state P3 may correspond to data '000,' the fourth program state P4 may correspond to data '010,' the fifth program state P5 may correspond to data '011,' the sixth program state P6 may correspond to data '001,' and the seventh program state P7 may correspond to data '101.' However, the data corresponding to each program state is merely illustrative, and may be variously modified.

The memory device may perform a read operation using a first read voltage R1 to a seventh read voltage R7, thereby reading data stored in selected memory cells.

The first read voltage R1 may be a read voltage for distinguishing the erase state E from the first program state P1. The second read voltage R2 may be a read voltage for distinguishing the first program state P1 from the second program state P2. The third read voltage R3 may be a read voltage for distinguishing the second program state P2 from the third program state P3. The fourth read voltage R4 may be a read voltage for distinguishing the third program state P3 from the fourth program state P4. The fifth read voltage R5 may be a read voltage for distinguishing the fourth program state P4 from the fifth program state P5. The sixth read voltage R6 may be a read voltage for distinguishing the fifth program state P5 from the sixth program state P6, and the seventh read voltage R7 may be a read voltage for distinguishing the sixth program state P6 from the seventh program state P7.

FIG. 9B illustrates pages read according to states of memory cells, when the memory device 100 shown in FIG. 1 performs the program direct read operation.

Specifically, when the memory device performs the program direct read operation, the memory device may read programmed data after a program verify operation passes.

In the program operation using the TLC scheme, data corresponding to three bits, which is stored in a memory cell, may be divided into logical data of a Least Significant Bit page (LSB page), a Central Significant Bit page (CSB page), and a Most Significant Bit page (MSB page). Therefore, the memory device may perform a read operation according to data of the LSB page, the CSB page, or the MSB page.

For example, the memory device may read the LSB page among the programmed data. When the memory device reads the LSB page, memory cells of the erase state E and the fifth to seventh program states P5 to P7 may be read as '1,' and memory cells of the first to fourth program states P1 to P4 may be read as '0.'

In an embodiment, when a number of times program fail information is received, which the memory controller 200 shown in FIG. 1 counts, exceeds a reference value, the memory device may additionally read at least one of the MSB page and the CBS page. That is, in order to ensure the reliability of the read data, the memory device may read another page in addition to the LSB page.

When the MSB page is read, memory cells of the erase state E and the first, second, and seventh program states P1, P2, and P7 may be read as '1,' and memory cells of the third to sixth program states P3 to P6 may be read as '0.' When the CBS page is read, memory cells of the erase state E and the first, fourth, and fifth program states P1, P4, and P5 may be read as '1,' memory cells of the second, third, sixth, and seventh program states P2, P3, P6, and P7 may be read as '0.'

The memory device may determine the passing or failure of the program operation, based on fail bits respectively included in the read pages. In an embodiment, when the passing or failure of the program operation is not determined through the LSB page and the additionally read page, another page may be read. That is, when a number of fail bits included in any one of the read pages exceeds a number of allow bits and a number of fail bits included in another of the read pages does not exceed the number of allow bits, another page may be additionally read. The passing or failure of the program operation may be determined based on a number of fail bits included in the additionally read page.

FIGS. 10A and 10B illustrate a logical page read in a program scheme of a quadruple level cell.

Referring to FIGS. 10A and 10B, FIG. 10A illustrates an erase state E and first to fifteenth program states P1 to P15 when the memory device 100 shown in FIG. 1 performs a program operation by using a Quadruple Level Cell (QLC) scheme, and FIG. 10B illustrates a logical page read after the memory device 100 shown in FIG. 1 performs the program operation by using the QLC scheme. The logical page may be a page read when the memory device 100 executes the program direct read command.

FIG. 10A illustrates a case where a memory cell stores data corresponding to four bits. In FIG. 10A, the horizontal axis represents threshold voltage Vth according to states of memory cells, and the vertical axis represents number of memory cells.

In FIG. 10A, a program operation using the QLC scheme in which one memory cell stores data corresponding to four bits is described as an example. Each memory cell may be programmed to have a threshold voltage corresponding to any one of the erase state E and the first to fifteenth program states P1 to P15. That is, the memory cell may be programmed to have a threshold voltage corresponding to any one of the erase state E, the first program state P1, the second program state P2, the third program state P3, the fourth program state P4, the fifth program state P5, the sixth program state P6, the seventh program state P7, the eighth program state P8, the ninth program state P9, the tenth program state P10, the eleventh program state P11, the twelfth program state P12, the thirteenth program state P13, the fourteenth program state P14, and the fifteenth program state P15. Memory cells may have a threshold voltage distribution corresponding to the erase state E before the program operation is performed.

The erase state E may correspond to data '1111,' the first program state P1 may correspond to data '1110,' the second program state P2 may correspond to data '1100,' the third program state P3 may correspond to data '1000,' the fourth program state P4 may correspond to data '0000,' the fifth program state P5 may correspond to data '0100,' the sixth program state P6 may correspond to data '0101,' the seventh program state P7 may correspond to data '0111,' the eighth program state P8 may correspond to data '0110,' the ninth program state P9 may correspond to data '0010,' the tenth program state P10 may correspond to data '1010,' the eleventh program state P11 may correspond to data '1011,' the twelfth program state P12 may correspond to data '0011,' the thirteenth program state P13 may correspond to data '0001,' the fourteenth program state P14 may correspond to data '1001,' and the fifteenth program state P15 may correspond to data '1101.' However, the data corresponding to each program state is merely illustrative, and may be variously modified.

The memory device may perform a read operation using a first read voltage R1 to a fifteenth read voltage R15, thereby reading data stored in selected memory cells.

The first read voltage R1 may be a read voltage for distinguishing the erase state E from the first program state P1. The second read voltage R2 may be a read voltage for distinguishing the first program state P1 from the second program state P2. The third read voltage R3 may be a read voltage for distinguishing the second program state P2 from the third program state P3. The fourth read voltage R4 may be a read voltage for distinguishing the third program state P3 from the fourth program state P4. The fifth read voltage R5 may be a read voltage for distinguishing the fourth program state P4 from the fifth program state P5. The sixth read voltage R6 may be a read voltage for distinguishing the fifth program state P5 from the sixth program state P6. The seventh read voltage R7 may be a read voltage for distinguishing the sixth program state P6 from the seventh program state P7. The eighth read voltage R8 may be a read voltage for distinguishing the seventh program state P7 from the eighth program state P8. The ninth read voltage R9 may be a read voltage for distinguishing the eighth program state P8 from the ninth program state P9. The tenth read voltage R10 may be a read voltage for distinguishing the ninth program state P9 from the tenth program state P10. The eleventh read voltage R11 may be a read voltage for distinguishing the tenth program state P10 from the eleventh program state P11. The twelfth read voltage R12 may be a read voltage for distinguishing the eleventh program state P11 from the twelfth program state P12. The thirteenth read voltage R13 may be a read voltage for distinguishing the twelfth program state P12 from the thirteenth program state P13. The fourteenth read voltage R14 may be a read voltage for distinguishing the thirteenth program state P13 from the fourteenth program state P14, and the fifteenth read voltage R15 may be a read voltage for distinguishing the fourteenth program state P14 from the fifteenth program state P15.

FIG. 10B illustrates pages read according to states of memory cells, when the memory device 100 shown in FIG. 1 performs the program direct read operation.

Specifically, when the memory device performs the program direct read operation, the memory device may read programmed data after a program verify operation passes.

In the program operation using the QLC scheme, data corresponding to four bits, which is stored in a memory cell, may be divided into logical data of a Least Significant Bit page (LSB page), a Central Significant Bit page (CSB page), a Most Significant Bit page (MSB page), and a Quad Significant Bit page (QSB page). Therefore, the memory device may perform a read operation according to data of the LSB page, the CSB page, the MSB page, or the QSB page.

For example, the memory device may read the LSB page among the programmed data. When the memory device reads the LSB page, memory cells of the erase state E and the sixth, seventh, and eleventh to fifteenth program states P6, P7, and P11 to P15 may be read as '1,' and memory cells of the first to fifth and eighth to tenth program states P1 to P5 and P8 to P10 may be read as '0.'

In an embodiment, when a number of times program fail information is received, which the memory controller 200 shown in FIG. 1 counts, exceeds a reference value, the memory device may additionally read at least one of the QSB page, the MSB page, and the CBS page. That is, in order to ensure the reliability of the read data, the memory device may read another page in addition to the LSB page.

When the QSB page is read, memory cells of the erase state E and the first to third, tenth, eleventh, fourteenth, and fifteenth program states P1 to P3, P10, P11, P14, and P14 may be read as '1,' and memory cells of the fourth to ninth, twelfth, and thirteenth program states P4 to P9, P12, and P13 may be read as '0.' When the MBS page is read, memory cells of the erase state E and the first, second, fifth to eighth, and fifteenth program states P1, P2, P5 to P8, and P15 may be read as '1,' memory cells of the third, fourth, and ninth to fourteenth program states P3, P4, and P9 to P14 may be read as '0.' When the CBS page is read, memory cells of the erase state E and the first and seventh to twelfth program states P1 and P7 to P12 may be read as '1,' memory cells of the second to sixth and thirteenth to fifteenth program states P2 to P6 and P13 to P15 may be read as '0.'

The memory device may determine passing or failure of the program operation, based on fail bits respectively included in the read pages. In an embodiment, when the passing or failure of the program operation is not determined through the LSB page and the additionally read page, another page may be read. That is, when a number of fail bits included in any one of the read pages exceeds a number of allow bits and a number of fail bits included in another of the read pages does not exceed the number of allow bits, another page may be additionally read. The passing or failure of the program operation may be determined based on a number of fail bits included in the additionally read page.

FIG. 11 is a diagram illustrating an operation of the memory controller 200 in accordance with an embodiment of the present disclosure.

Referring to FIG. 11, at S1101, the memory device 100 may receive a program direct read command from the memory controller 200. The program direct read command may be a command instructing the memory device 100 to determine the passing or failure of a program operation, based on read data obtained by reading programmed data, when a program verify operation passes after the memory device 100 performs the program operation.

When the memory device 100 receives the program direct read command, the memory device 100 may set a number of allow bits (S1103). The allow bits may be bits a number of which is compared with a number of fail bits included in data read in response to the program direct read command. Allow bits may be stored in the allow bit setting register 150. The allow bits stored in the allow bit setting register 150 may be provided to the sensing circuit 126.

At S1105, the memory device 100 may determine whether a program verify operation has passed. That is, when a program verify operation is performed after a program operation corresponding to the program direct read command is performed, the memory device 100 may determine whether the program verify operation has passed.

When the program verify operation fails (N), the memory device 100 may output program fail information to the memory controller 200 (S1113). When the program verify operation does not pass even though the memory device 100 has performed all set program loops, the program fail information may be output.

When the program verify operation passes (Y), the memory device 100 may perform a read operation of reading programmed data (S1107). That is, when the memory device 100 performs an operation corresponding to the program direct read command, the memory device 100 may perform a read operation on programmed data after the program verify operation passes. The memory device 100 may read an LSB page. In an embodiment, the memory device 100 may read another page in addition to the LSB page.

When the read operation of reading the programmed data is performed, the memory device 100 may determine whether a number of fail bits included in the read data exceeds a number of allow bits (S1109). That is, the memory device 100 may compare the fail bits included in the read data and allow bits provided from the allow bit setting register, without outputting the read data to the memory controller 200. The memory device 100 may determine passing or failure of the program operation, based on the fail bits included in the read data and the allow bits.

When the number of fail bits included in the read data does not exceed the number of allow bits (N), the memory device 100 may output program pass information to the memory controller (S1111). That is, when the number of fail bits included in the read data is smaller than the number of allow bits, the memory device 100 may determine that the program operation has passed, based on the read data instead of the program verify operation.

When the number of fail bits included in the read data exceeds the number of allow bits (Y), the memory device 100 may output program fail information to the memory controller (S1113). That is, when the number of fail bits included in the read data exceeds the number of allow bits, the memory device 100 may determine whether the program operation has failed, based on the read data instead of the program verify operation.

Figure 12:
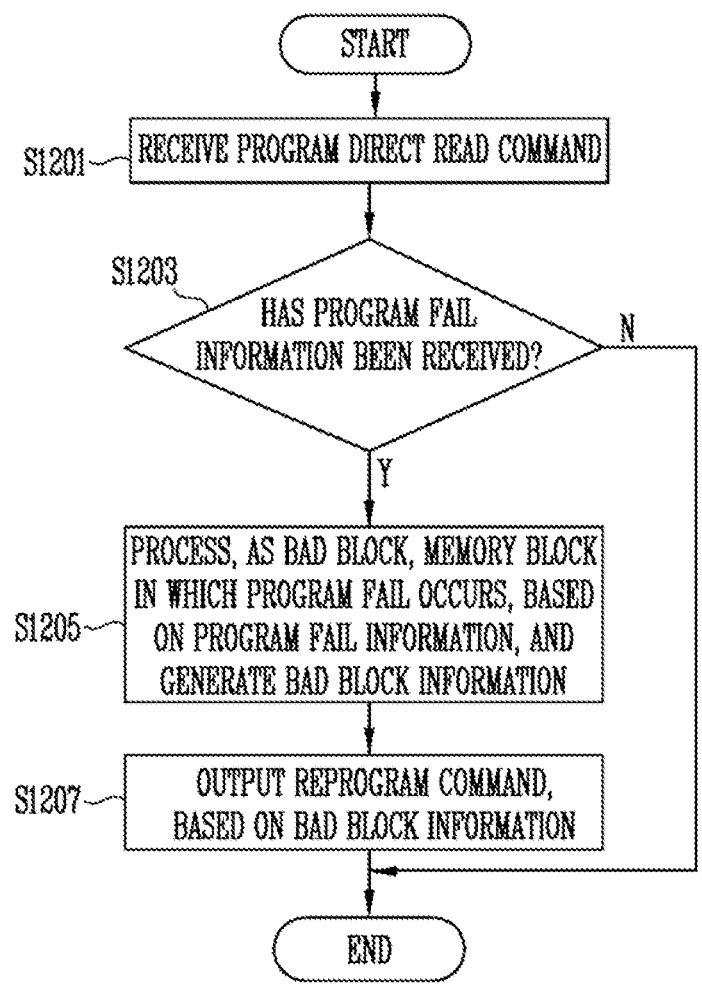
FIG. 12 is a diagram illustrating an operation of the memory controller in accordance with an embodiment of the present disclosure.

FIG. 12 is a diagram illustrating an operation of the memory controller 200 in accordance with an embodiment of the present disclosure.

Referring to FIG. 12, at S1201, the memory controller 200 may output a program direct read command to the memory device 100. The program direct read command may be a command corresponding to a request received from the host 300. After the memory controller 200 outputs the program direct read command to the memory device 100, the memory controller 200 may receive a response to the program direct read command. The response to the program direct read command may be program pass information or program fail information.

At S1203, it may be determined whether the memory controller 200 has received program fail information. That is, it may be determined whether the memory controller 200 has received program fail information as the response to the program direct read command from the memory device 100.

When the memory controller 200 receives the program fail information (Y), the memory controller 200 may process, as a bad block, a memory block including a memory cell in which the program fail occurs, based on the program fail information, and generate bad block information (S1205).

In an embodiment, the memory controller 200 may process, as a bad block, a memory block including program-fail memory cells, based on the program fail information. That is, the memory controller 200 may record that the corresponding memory block is a bad block in the bad block management table, and might not allow an address corresponding to the memory block recorded in the bad block management table to be output.

Also, after the memory controller 200 processes a memory block including program-fail memory cells as a bad block, the memory controller 200 may generate bad block information representing that the bad block has occurred. That is, the memory controller 200 may generate bad block information representing that, although the memory device 100 has performed an operation corresponding to the program direct read command, a program operation has failed, and the memory block in which program fail occurs is a bad block.

When the bad block information is generated, the memory controller 200 may output a reprogram command to the memory device 100, based on the bad block information (S1207). Specifically, because the program operation has failed, it might be necessary to reprogram data stored in the latch in the memory device 100. Therefore, the memory controller 200 may output the reprogram command to the memory device 100 such that the memory device 100 re-performs the program operation.

Figure 13:
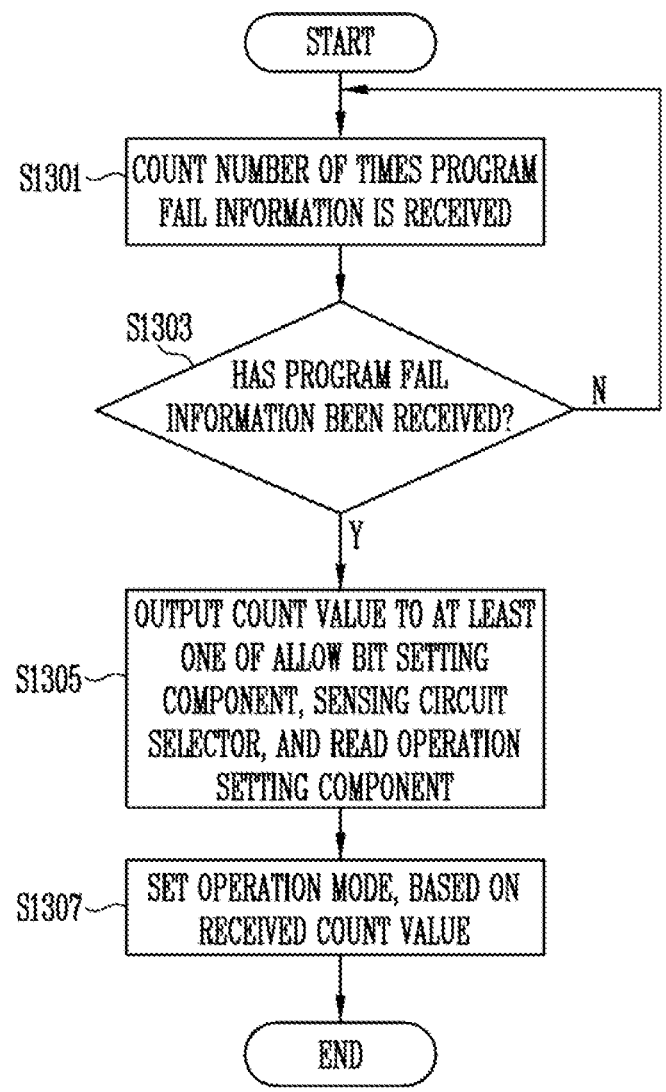
FIG. 13 is a diagram illustrating an operation of the memory controller in accordance with an embodiment of the present disclosure.

FIG. 13 is a diagram illustrating an operation of the memory controller 200 in accordance with an embodiment of the present disclosure.

Referring to FIG. 13, at S1301, the memory controller 200 may receive program fail information, and generate a count value by counting a number of times fail information is received. The program fail information may be a response to a program direct read command. The program fail information may be output from the memory device 100, when a number of fail bits included in read data exceeds a number of allow bits.

The memory controller 200 may determine whether the count value generated by counting the number of times the fail information is received exceeds a reference value (S1303). That is, the memory controller 200 may determine whether a number of times a program fail occurs has been increased, even when the memory device 100 performs an operation corresponding to the program direct read command received from the memory controller 200.

When the count value generated by the memory controller 200 does not exceed the reference value (N), the memory controller 200 may generate a count value by re-counting a number of times fail information is received (S1301).

When the count value generated by the memory controller 200 exceeds the reference value (Y), the memory controller 200 may output the count value to at least one of the allow bit setting component, the sensing circuit selector, and the read operation setting component (S1305). When at least one of the allow bit setting component, the sensing circuit selector, and the read operation setting component receives the count value, the memory controller 200 may set an operation mode of the memory device 100, based on the received count value (S1307).

Specifically, the allow bit setting component may output an allow bit setting command for changing allow bits stored in the allow bit setting register included in the memory device 100, based on the received count value. The sensing circuit selector may control the CSC among the circuits included in the sensing circuit to perform a sensing operation, based on the received count value. The read operation setting component may set a page to be read and/or a read voltage when the program direct read command is executed, based on the received count value.

Figure 14:
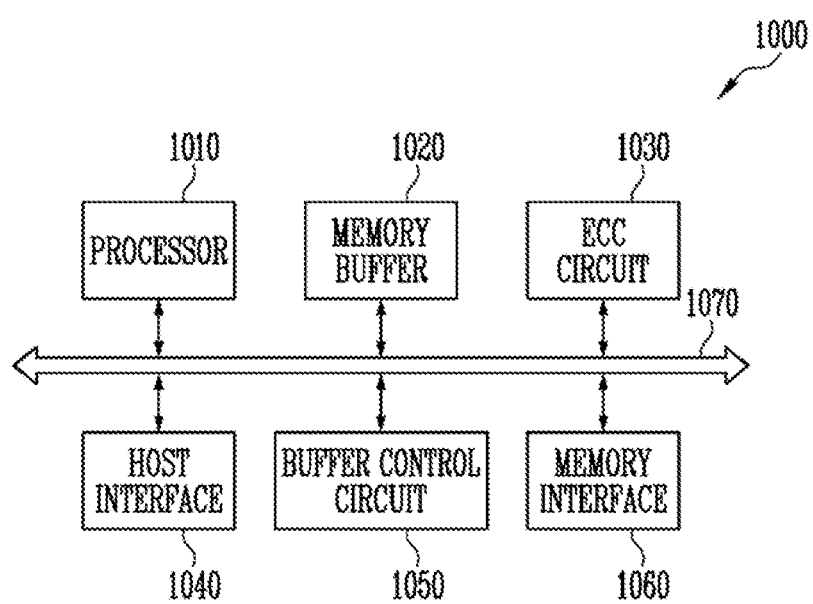
FIG. 14 is a diagram illustrating another embodiment of the memory controller shown in FIG. 1.

FIG. 14 is a diagram illustrating another embodiment of the memory controller 200 shown in FIG. 1.

Referring to FIG. 14, a memory controller 1000 is coupled to a host (not shown) and a memory device (not shown). The memory controller 1000 is configured to access the memory device in response to a request received from the host. For example, the memory controller 1000 is configured to control read, program, erase, and background operations of the memory device. The memory controller 1000 is configured to provide an interface between the memory device and the host. The memory controller 1000 is configured to drive firmware for controlling the memory device.

The memory controller 1000 may include a processor 1010, a memory buffer 1020, an error correction code (ECC) circuit 1030, a host interface 1040, a buffer control circuit 1050, a memory interface 1060, and a bus 1070.

The bus 1070 may be configured to provide channels between components of the memory controller 1000.

The processor 1010 may control overall operations of the memory controller 1000, and perform a logical operation. The processor 1010 may communicate with the external host through the host interface 1040, and communicate with the memory device through the memory interface 1060. Also, the processor 1010 may communicate with the memory buffer 1020 through the buffer control circuit 1050. The processor 1010 may control an operation of the storage device, using the memory buffer 1020 as a working memory, a cache memory or a buffer memory.

The processor 1010 may perform a function of a flash translation layer (FTL). The processor 1010 may translate a logical block address (LBA) provided by the host through the FTL into a physical block address (PBA). The FTL may receive an LPA, using a mapping table, to be translated into a PBA. Several address mapping methods of the FTL exist according to mapping units. A representative address mapping method includes a page mapping method, a block mapping method, and a hybrid mapping method.

The processor 1010 is configured to randomize data received from the host. For example, the processor 1010 may randomize data received from the host, using a randomizing seed. The randomized data is provided as data to be stored to the memory device to be programmed in the memory cell array.

The processor 1010 may output a program direct read command to the memory device 100 shown in FIG. 1. The program direct read command may be a command instructing the memory device to determine the passing or failure of a program operation, based on read data obtained by reading programmed data, when a program verify operation passes after the memory device performs the program operation.

Subsequently, the processor 1010 may manage a bad block by receiving program fail information corresponding to the program direct read command from the memory device, and output a reprogram command to the memory device such that the program operation is re-performed.

The processor 1010 may perform randomizing and derandomizing by driving software or firmware.

The memory buffer 1020 may be used as the working memory, the cache memory, or the buffer memory of the processor 1010. The memory buffer 1020 may store codes and commands, which are executed by the processor 1010. The memory buffer 1020 may include Static RAM (SRAM) or Dynamic RAM (DRAM).

The ECC circuit 1030 may perform an ECC operation. The ECC circuit 1030 may perform ECC encoding on data to be written in the memory device through the memory interface 1060. The ECC encoded data may be transferred to the memory device through the memory interface 1060. The ECC circuit 1030 may perform ECC decoding on data received from the memory device through the memory interface 1060. In an example, the ECC circuit 1030 may be included as a component of the memory interface 1060 in the memory interface 1060.

The host interface 1040 may communicate with the external host under the control of the processor 1010. The host interface 1040 may communicate with the host, using at least one of various communication manners, such as a Universal Serial bus (USB), a Serial AT Attachment (SATA), a High Speed InterChip (HSIC), a Small Computer System Interface (SCSI), Firewire, a Peripheral Component Interconnection (PCI), a PCI express (PCIe), a nonvolatile memory express (NVMe), a Universal Flash Storage (UFS), a Secure Digital (SD), a Multi-Media Card (MMC), an embedded MMC (eMMC), a Dual In-line Memory Module (DIMM), a Registered DIMM (RDIMM), and a Load Reduced DIMM (LRDIMM).

The buffer control circuit 1050 is configured to control the memory buffer 1020 under the control of the processor 1010.

The memory interface 1060 is configured to communicate with the memory device under the control of the processor 1010. The memory interface 1060 may communicate a command, an address, and data with the memory device through a channel.

In an example, the memory controller 1000 might not include the memory buffer 1020 and the buffer control circuit 1050.

In an example, the processor 1010 may control an operation of the memory controller 1000 by using codes. The processor 1010 may load codes from a nonvolatile memory device (e.g., a read only memory (ROM)) provided in the memory controller 1000. In another example, the processor 1010 may load codes from the memory device through the memory interface 1060.

In an example, the bus 1070 of the memory controller 1000 may be divided into a control bus and a data bus. The data bus may be configured to transmit data in the memory controller 1000, and the control bus may be configured to transmit control information such as a command and an address in the memory controller 1000. The data bus and the control bus are separate from each other, and might not interfere with or influence each other. The data bus may be coupled to the host interface 1040, the buffer control circuit 1050, the ECC circuit 1030, and the memory interface 1060. The control bus may be coupled to the host interface 1040, the processor 1010, the buffer control circuit 1050, the memory buffer 1020, and the memory interface 1060.

Figure 15:
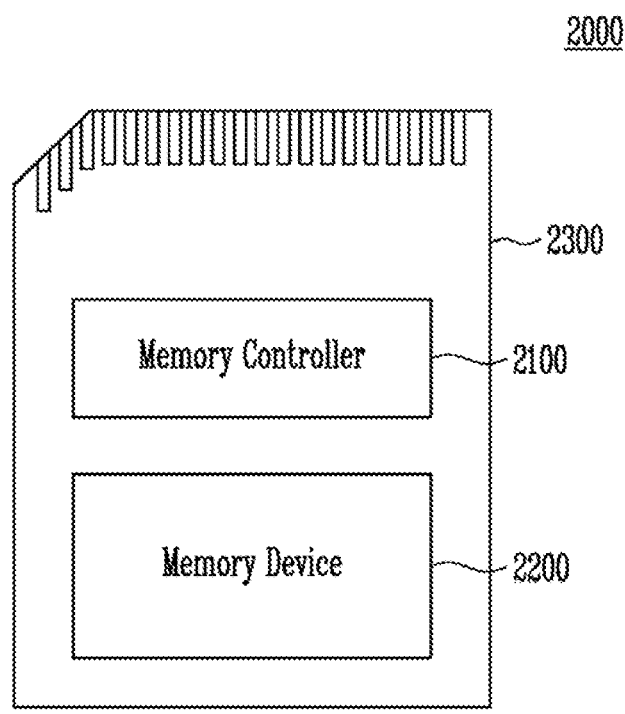
FIG. 15 is a block diagram illustrating a memory card system to which the storage device is applied in accordance with an embodiment of the present disclosure.

FIG. 15 is a block diagram illustrating a memory card system 2000 to which a storage device is applied in accordance with an embodiment of the present disclosure.

Referring to FIG. 15, the memory card system 2000 includes a memory controller 2100, a memory device 2200, and a connector 2300.

The memory controller 2100 is coupled to the memory device 2200. The memory controller 2100 is configured to access the memory device 2200. For example, the memory controller 2100 is configured to control read, write, erase, and background operations of the memory device 2200. The memory controller 2100 is configured to provide an interface between the memory device 2200 and a host (not shown). The memory controller 2100 is configured to driver firmware for controlling the memory device 2200. The memory device 2200 may be implemented identically to the memory device 100 described with reference to FIG. 5.

The memory controller 2100 may output a program direct read command to the memory device 100 shown in FIG. 1. The program direct read command may be a command instructing the memory device to determine the passing or failure of a program operation, based on read data obtained by reading programmed data, when a program verify operation passes after the memory device performs the program operation.

Subsequently, the memory controller 2100 may manage a bad block by receiving program fail information corresponding to the program direct read command from the memory device, and output a reprogram command to the memory device such that the program operation is re-performed.

In an example, the memory controller 2100 may include components such as a Random Access Memory (RAM), a processing unit, a host interface, a memory interface, and an ECC circuit.

The memory controller 2100 may communicate with an external device through the connector 2300. The memory controller 2100 may communicate with the external device (e.g., the host) according to a specific communication protocol. In an example, the memory controller 2100 may communicate with the external device through at least one of various communication protocols such as a Universal Serial Bus (USB), a Multi-Media Card (MMC), an embedded MMC (eMMC), a Peripheral Component Interconnection (PCI), a PCI express (PCIe), an Advanced Technology Attachment (ATA), a Serial-ATA (SATA), a Parallel-ATA (PATA), a Small Computer System Interface (SCSI), an Enhanced Small Disk Interface (ESDI), an Integrated Drive Electronics (IDE), firewire, a Universal Flash Storage (UFS), Wi-Fi, Bluetooth, and NVMe.

In an example, the memory device 2200 may be implemented with various nonvolatile memory devices such as an Electrically Erasable and Programmable ROM (EEPROM), a NAND flash memory, a NOR flash memory, a Phase-change RAM (PRAM), a Resistive RAM (ReRAM), a Ferroelectric RAM (FRAM), and a Spin Torque Transfer magnetic RAM (STT-M RAM).

The memory controller 2100 and the memory device 2200 may be integrated into a single semiconductor device, to constitute a memory card. For example, the memory controller 2100 and the memory device 2200 may constitute a memory card such as a PC card (Personal Computer Memory Card International Association (PCMCIA)), a Compact Flash (CF) card, a Smart Media Card (SM and SMC), a memory stick, a Multi-Media Card (MMC, RS- MMC, MMCmicro and eMMC), an SD card (SD, miniSD, microSD and SDHC), and a Universal Flash Storage (UFS).

Figure 16:
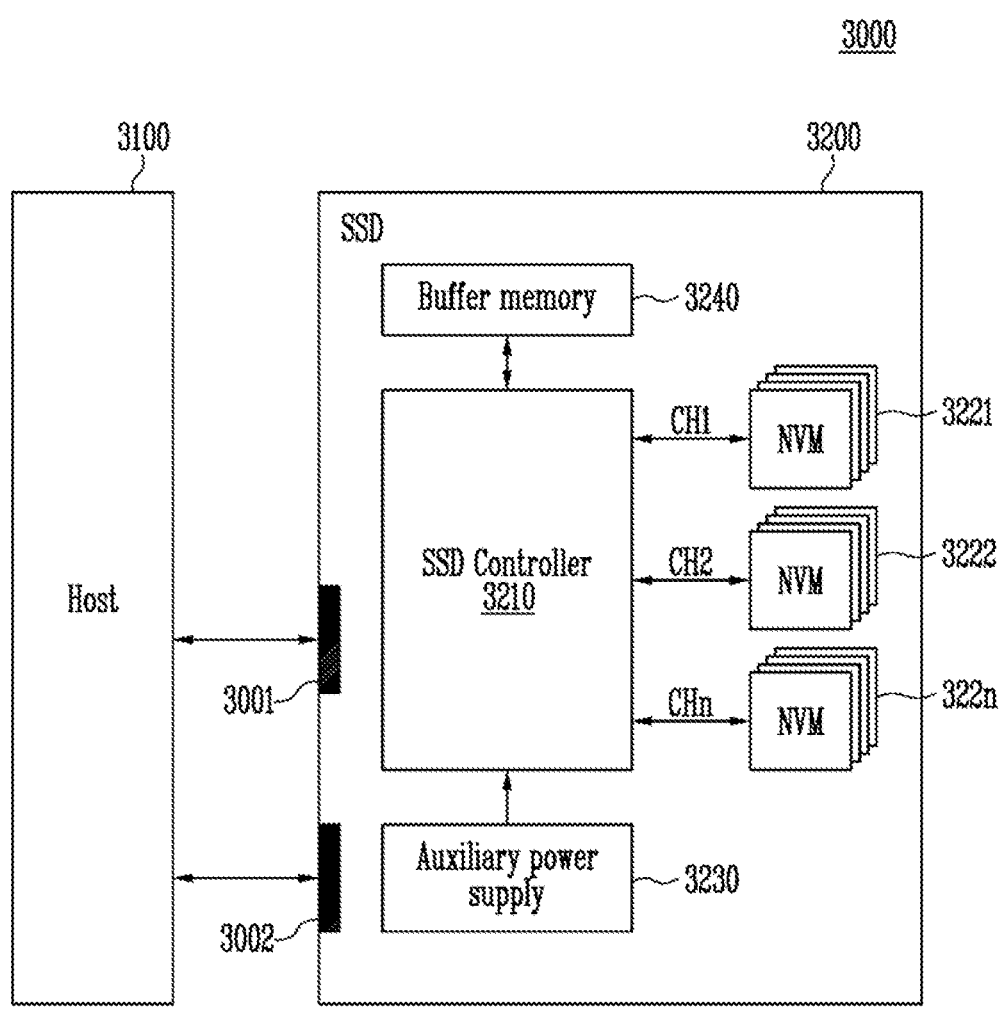
FIG. 16 is a block diagram illustrating a Solid State Drive (SSD) system to which the storage device is applied in accordance with an embodiment of the present disclosure.

FIG. 16 is a block diagram illustrating a Solid State Drive (SSD) system 3000 to which a storage device is applied in accordance with an embodiment of the present disclosure.

Referring to FIG. 16, the SSD system 3000 includes a host 3100 and an SSD 3200. The SSD 3200 exchanges a signal SIG with the host 3100 through a signal connector 3001, and receives power PWR through a power connector 3002. The SSD 3200 includes an SSD controller 3210, a plurality of flash memories 3221 to 322n, an auxiliary power supply 3230, and buffer memory 3240.

In an embodiment, the SSD controller 3210 may serve as the memory controller 200 described with reference to FIG. 1.

The SSD controller 3210 may control the plurality of flash memories 3221 to 322n in response to a signal SIG received from the host 3100. In an example, the signal SIG may be a signal based on an interface between the host 3100 and the SSD 3200. For example, the signal SIG may be a signal defined by at least one of interfaces such as a Universal Serial Bus (USB), a Multi-Media Card (MMC), an embedded MMC (eMMC), a Peripheral Component Interconnection (PCI), a PCI express (PCIe), an Advanced Technology Attachment (ATA), a Serial-ATA (SATA), a Parallel-ATA (PATA), a Small Computer System Interface (SCSI), an Enhanced Small Disk Interface (ESDI), an Integrated Drive Electronics (IDE), a firewire, a Universal Flash Storage (UFS), a WI-FI, a Bluetooth, and an NVMe.

The SSD controller 3210 may output a program direct read command to the plurality of flash memories 3221 to 322n. The program direct read command may be a command instructing the memory device to determine the passing or failing of a program operation, based on read data obtained by reading programmed data, when a program verify operation passes after the plurality of flash memories 3221 to 322n performs the program operation.

Subsequently, the SSD controller 3210 may manage a bad block by receiving program fail information corresponding to the program direct read command from the plurality of flash memories 3221 to 322n, and output a reprogram command to the plurality of flash memories 3221 to 322n such that the program operation is re-performed.

The auxiliary power supply 3230 is coupled to the host 3100 through the power connector 3002. When the supply of power from the host 3100 is not smooth, the auxiliary power supply 3230 may provide power of the SSD 3200. In an example, the auxiliary power supply 3230 may be located in the SSD 3200, or be located at the outside of the SSD 3200. For example, the auxiliary power supply 3230 may be located on a main board, and provide auxiliary power to the SSD 3200.

The buffer memory 3240 operates as a buffer memory of the SSD 3200. For example, the buffer memory 3240 may temporarily store data received from the host 3100 or data received from the plurality of flash memories 3221 to 322n, or temporarily store meta data (e.g., a mapping table) of the flash memories 3221 to 322n. The buffer memory 3240 may include volatile memories such as a DRAM, an SDRAM, a DDR SDRAM, an LPDDR SDRAM, and a GRAM or nonvolatile memories such as a FRAM, a ReRAM, an STT-MRAM, and a PRAM.

Figure 17:
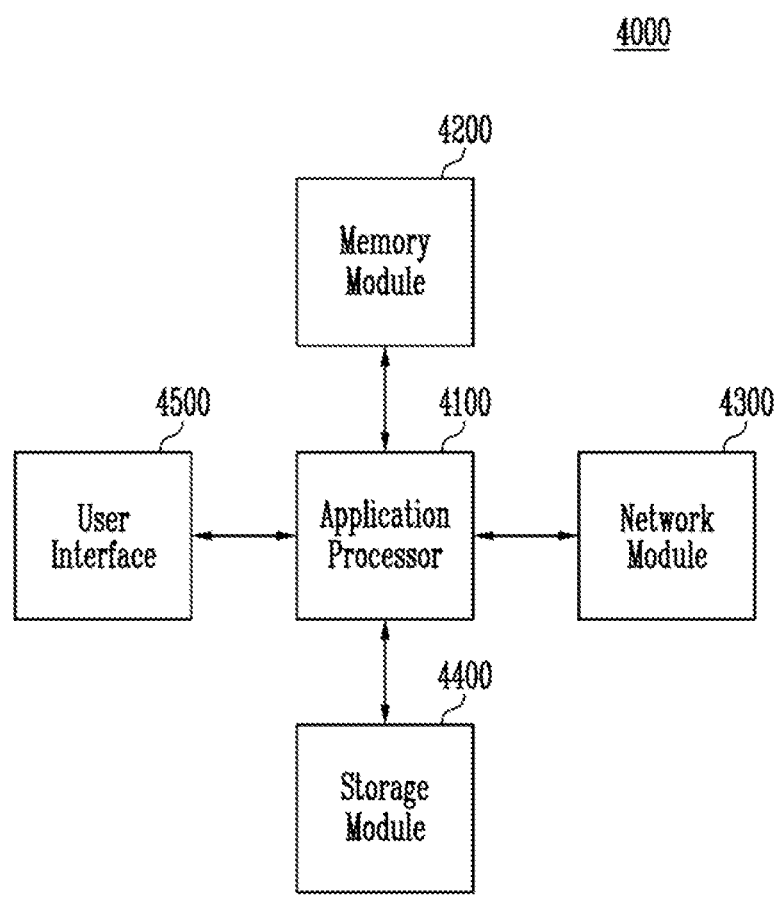
FIG. 17 is a block diagram illustrating a user system to which the storage device is applied in accordance with an embodiment of the present disclosure.

FIG. 17 is a block diagram illustrating a user system 4000 to which a storage device is applied in accordance with an embodiment of the present disclosure.

Referring to FIG. 17, the user system 4000 includes an application processor 4100, a memory module 4200, a network module 4300, a storage module 4400, and a user interface 4500.

The application processor 4100 may drive components included in the user system 4000, an operating system (OS), a user program, or the like. In an example, the application processor 4100 may include controllers for controlling components included in the user system 4000, interfaces, a graphic engine, and the like. The application processor 4100 may be provided as a System-on-Chip (SoC).

The application processor 4100 may output a program direct read command to the storage module 4400. The program direct read command may be a command instructing the memory device to determine the passing or failure of a program operation, based on read data obtained by reading programmed data, when a program verify operation passes after the storage module 4400 performs the program operation.

Subsequently, the application processor 4100 may manage a bad block by receiving program fail information corresponding to the program direct read command from the storage module 4400, and output a reprogram command to the storage module 4400 such that the program operation is re-performed.

The memory module 4200 may operate as a main memory, working memory, buffer memory or cache memory of the user system 4000. The memory module 4200 may include volatile random access memories such as a DRAM, an SDRAM, a DDR SDRAM, a DDR2 SDRM, a DDR3 SDRAM, an LPDDR SDRAM, an LPDDR2 SDRAM, and an LPDDR3 SDRAM or nonvolatile random access memories such as a PRAM, a ReRAM, an MRAM, and a FRAM. In an example, the application processor 4100 and the memory module 4200 may be provided as one semiconductor package by being packaged based on a Package on Package (PoP).

The network module 4300 may communicate with external devices. In an example, the network module 4300 may support wireless communications such as Code Division Multiple Access (CDMA), Global System for Mobile communication (GSM), Wideband CDMA (WCDMA), CDMA-2000, Time Division Multiple Access (TDMA), Long Term Evolution (LTE), Wimax, WLAN, UWB, Bluetooth, and Wi-Fi. In an example, the network module 4300 may be included in the application processor 4100.

The storage module 4400 may store data. For example, the storage module 4400 may store data received from the application processor 4100. Alternatively, the storage module 4400 may transmit data stored therein to the application processor 4100. In an example, the storage module 4400 may be implemented with a nonvolatile semiconductor memory device such as a Phase-change RAM (PRAM), a Magnetic RAM (MRAM), a Resistive RAM (RRAM), a NAND flash, a NOR flash, or a NAND flash having a three-dimensional structure. In an example, the storage module 4400 may be provided as a removable drive such as a memory card of the user system 4000 or an external drive.

In an example, the storage module 4400 may include a plurality of nonvolatile memory devices, and the plurality of nonvolatile memory devices may operate identically to the memory device described with reference to FIGS. 5 to 8. The storage module 4400 may operate identically to the storage device 50 described with reference to FIG. 1.

The user interface 4500 may include interfaces for inputting data or commands to the application processor 4100 or outputting data to an external device. In an example, the user interface 4500 may include user input interfaces such as a keyboard, a keypad, a button, a touch panel, a touch screen, a touch pad, a touch ball, a camera, a microphone, a gyroscope sensor, a vibration sensor and a piezoelectric element. The user interface 4500 may include user output interfaces such as a Liquid Crystal Display (LCD), an Organic Light Emitting Diode (OLED) display device, an Active Matrix OLED (AMOLED) display device, an LED, a speaker, and a monitor.

Provided, in accordance with the present disclosure, is a storage device for performing a read operation together with a program operation and an operating method of the storage device.

While various embodiments the present disclosure have been illustrated and described, it will be understood by those skilled in the art that various changes in form and detail may be made to the presented embodiments without departing from the spirit and scope of the present disclosure as defined by the appended claims and their equivalents. Therefore, the scope of the present disclosure should not be limited to the above-described embodiments but should be determined by not only the appended claims but also the equivalents thereof.

In the above-described embodiments, all operations may be selectively performed or some of the operations may be omitted. In each embodiment, the operations are not necessarily performed in accordance with the described order and may be rearranged. The embodiments disclosed in this specification and drawings are only examples to facilitate an understanding of the present disclosure, and the present disclosure is not limited thereto. That is, it should be apparent to those skilled in the art that various modifications can be made on the basis of the technological scope of the present disclosure.

Meanwhile, the embodiments of the present disclosure have been described in the drawings and specification. Although specific terminologies are used here, those are only to explain the embodiments of the present disclosure. Therefore, the present disclosure is not restricted to the above-described embodiments and many variations are possible within the spirit and scope of the present disclosure. It should be apparent to those skilled in the art that various modifications can be made on the basis of the technological scope of the present disclosure in addition to the embodiments disclosed herein.

What is claimed is:

1. A storage device, comprising:
    a memory device configured to include a plurality of memory blocks including memory cells coupled to a plurality of word lines; and
    a memory controller configured to control the memory device,
    wherein the memory controller provides a command instructing to store data in memory cells coupled to a selected word line among the plurality of word lines, and
    wherein the memory device, in response to the command, performs a program operation of storing the data in the memory cells coupled to the selected word line, the program operation including a program verify operation, performs a read operation of acquiring parts of the data stored after the program verify operation passes and provides, based on a result of the read operation, one of pass information indicating the program operation passes and fail information indicating the program operation fails to the memory controller.

2. The storage device of claim 1,
    wherein the data includes a plurality of logical pages, and
    wherein the parts of the data include one logical page among the plurality of logical pages.

3. The storage device of claim 1, wherein the memory device includes:
    peripheral circuits configured to perform the program operation and the read operation; and
    a control logic configured to control the peripheral circuits to perform the read operation after the program operation in response to the command.

4. The storage device of claim 3, wherein the control logic controls the peripheral circuits to compare a total number of fail bits included in the result of the read operation with predetermined counts, and to provide one of the pass information and the fail information based on comparison of the total number of fail bits with the predetermined counts.

5. The storage device of claim 4, wherein the peripheral circuits include:
    an allow bit setting register configured to store information related to the predetermined counts; and
    a sensing circuit configured to generate the pass information or the fail information.

6. The storage device of claim 5, wherein the sensing circuit generates the fail information if the total number of fail bits included in the parts of the data exceeds the predetermined counts.

7. The storage device of claim 5, wherein the sensing circuit generates the pass information if the total number of fail bits included in the parts of the data is equal to or less than the predetermined counts.

8. The storage device of claim 2, wherein the memory controller includes a fail information controller configured to control the memory device to change the one logical page among the plurality of logical pages according to a number of times the fail information is received.

9. The storage device of claim 4, wherein the memory controller includes a fail information controller configured to control the memory device to change the predetermined counts according to a number of times the fail information is received.

10. The storage device of claim 1, wherein the memory controller includes a bad block processor configured to set a memory block including the memory cells coupled to the selected word line as a bad block.

11. The storage device of claim 10, wherein the bad block processor generates bad block information including a physical address of the memory block including the memory cells coupled to the selected word line.

* * * * *